US008981809B2

(12) United States Patent
Rathburn

(10) Patent No.: US 8,981,809 B2
(45) Date of Patent: Mar. 17, 2015

(54) COMPLIANT PRINTED CIRCUIT SEMICONDUCTOR TESTER INTERFACE

(75) Inventor: James Rathburn, Mound, MN (US)

(73) Assignee: Hsio Technologies, LLC, Maple Grove, MN (US)

( * ) Notice: Subject to any disclaimer, the term of this patent is extended or adjusted under 35 U.S.C. 154(b) by 473 days.

(21) Appl. No.: 13/319,203

(22) PCT Filed: Jun. 28, 2010

(86) PCT No.: PCT/US2010/040188
§ 371 (c)(1),
(2), (4) Date: Nov. 7, 2011

(87) PCT Pub. No.: WO2011/002709
PCT Pub. Date: Jan. 6, 2011

(65) Prior Publication Data
US 2012/0056640 A1 Mar. 8, 2012

Related U.S. Application Data

(60) Provisional application No. 61/221,356, filed on Jun. 29, 2009.

(51) Int. Cl.
*G01R 31/02* (2006.01)
*G01R 1/04* (2006.01)
*G01R 1/073* (2006.01)

(52) U.S. Cl.
CPC .......... *G01R 1/0466* (2013.01); *G01R 1/07314* (2013.01); *G01R 1/0735* (2013.01); *G01R 1/07378* (2013.01)
USPC .. 324/762.03; 439/76.1; 439/91; 324/750.19; 324/750.24; 324/756.07; 324/537; 257/727

(58) Field of Classification Search
CPC ................................ H01L 22/30; H01L 24/00
USPC ..................................................... 324/762.03
See application file for complete search history.

(56) References Cited

U.S. PATENT DOCUMENTS 3,672,986 A 6/1972 Schneble, Jr. et al.
4,188,438 A 2/1980 Burns
(Continued)

FOREIGN PATENT DOCUMENTS

JP 2003/217774 7/2003
WO WO 91/14015 9/1991
(Continued)

OTHER PUBLICATIONS

Notification of Transmittal of the International Search Report and the Written Opinion of the International Searching Authority mailed Apr. 05, 2012 in International Application No. PCT/US2011/062321.
(Continued)

*Primary Examiner* — Benjamin M Baldridge
(74) *Attorney, Agent, or Firm* — Stoel Rives LLP

(57) ABSTRACT

A compliant printed circuit semiconductor tester interface that provides a temporary interconnect between terminals on integrated circuit (IC) devices being tested. The compliant printed circuit semiconductor tester interface includes at least one dielectric layer printed with recesses corresponding to a target circuit geometry. A conductive material is deposited in at least a portion of the recesses comprising a circuit geometry and a plurality of first contact pads accessible along a first surface of the compliant printed circuit. At least one dielectric covering layer is preferably applied over the circuit geometry. A plurality of openings in the dielectric covering layer are provided to permit electrical coupling of terminals on the IC device and the first contact pads. Testing electronics that to test electrical functions of the IC device are electrically coupled to the circuit geometry.

17 Claims, 29 Drawing Sheets

(56) References Cited

U.S. PATENT DOCUMENTS

| | | |
|---|---|---|
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,072,520 A | 12/1991 | Nelson |
| 5,127,837 A | 7/1992 | Shah et al. |
| 5,129,573 A | 7/1992 | Duffey |
| 5,161,983 A | 11/1992 | Ohno |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,785,538 A * | 7/1998 | Beaman et al. ............ 439/91 |
| 5,791,911 A | 8/1998 | Fasano et al. |
| 5,802,699 A | 9/1998 | Fjelstad et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,921,786 A * | 7/1999 | Slocum et al. ............ 439/72 |
| 5,925,931 A | 7/1999 | Yamamoto |
| 5,933,558 A | 8/1999 | Sauvageau et al. |
| 6,020,597 A | 2/2000 | Kwak |
| 6,062,879 A * | 5/2000 | Beaman et al. ............ 439/91 |
| 6,080,932 A | 6/2000 | Smith et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 * | 8/2001 | Brofman et al. ............ 439/91 |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,437,452 B2 | 8/2002 | Lin |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 * | 10/2002 | Cram ............ 324/756.07 |
| 6,477,286 B1 | 11/2002 | Ouchi |
| 6,506,438 B2 | 1/2003 | Duthaler et al. |
| 6,521,489 B2 | 2/2003 | Duthaler et al. |
| 6,545,291 B1 | 4/2003 | Amundson et al. |
| 6,574,114 B1 * | 6/2003 | Brindle et al. ............ 361/769 |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,750,551 B1 | 6/2004 | Frutschy et al. |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,856,151 B1 * | 2/2005 | Cram ............ 324/750.24 |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 * | 4/2006 | Higashi ............ 439/66 |
| 7,029,289 B2 | 4/2006 | Li |
| 7,040,902 B2 | 5/2006 | Li |
| 7,045,015 B2 | 5/2006 | Renn |
| 7,064,412 B2 | 6/2006 | Geissinger et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,422,439 B2 | 9/2008 | Rathburn et al. |
| 7,423,219 B2 | 9/2008 | Kawaguchi et al. |
| 7,427,717 B2 * | 9/2008 | Morimoto et al. ............ 174/254 |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,508,076 B2 | 3/2009 | Japp et al. |
| 7,527,502 B2 | 5/2009 | Li |
| 7,531,906 B2 * | 5/2009 | Lee ............ 257/778 |
| 7,537,461 B2 | 5/2009 | Rathburn |
| 7,538,415 B1 | 5/2009 | Lin et al. |

(56) References Cited

U.S. PATENT DOCUMENTS

| | | | |
|---|---|---|---|
| 7,548,430 B1 | 6/2009 | Huemoeller et al. | |
| 7,563,645 B2 | 7/2009 | Jaeck | |
| 7,595,454 B2 | 9/2009 | Kresge et al. | |
| 7,619,309 B2 | 11/2009 | Drexl et al. | |
| 7,621,761 B2 | 11/2009 | Mok et al. | |
| 7,632,106 B2 | 12/2009 | Nakamura | |
| 7,645,635 B2 | 1/2010 | Wood et al. | |
| 7,651,382 B2 | 1/2010 | Yasumura et al. | |
| 7,658,163 B2 | 2/2010 | Renn | |
| 7,674,671 B2 | 3/2010 | Renn | |
| 7,726,984 B2 | 6/2010 | Bumb et al. | |
| 7,748,110 B2 | 7/2010 | Asahi et al. | |
| 7,800,916 B2 | 9/2010 | Blackwell et al. | |
| 7,833,832 B2 | 11/2010 | Wood et al. | |
| 7,836,587 B2* | 11/2010 | Kim | 29/843 |
| 7,868,469 B2 | 1/2011 | Mizoguchi | |
| 7,897,503 B2 | 3/2011 | Foster et al. | |
| 7,898,087 B2 | 3/2011 | Chainer | |
| 7,999,369 B2 | 8/2011 | Malhan et al. | |
| 8,044,502 B2* | 10/2011 | Rathburn | 257/692 |
| 8,058,558 B2 | 11/2011 | Mok et al. | |
| 8,072,058 B2 | 12/2011 | Kim et al. | |
| 8,114,687 B2 | 2/2012 | Mizoguchi | |
| 8,120,173 B2 | 2/2012 | Forman et al. | |
| 8,148,643 B2 | 4/2012 | Hirose et al. | |
| 8,154,119 B2* | 4/2012 | Yoon et al. | 257/727 |
| 8,158,503 B2 | 4/2012 | Abe | |
| 8,159,824 B2 | 4/2012 | Cho et al. | |
| 8,178,978 B2 | 5/2012 | McElrea et al. | |
| 8,203,207 B2 | 6/2012 | Getz et al. | |
| 8,227,703 B2 | 7/2012 | Maruyama et al. | |
| 8,232,632 B2 | 7/2012 | Rathburn | |
| 8,247,702 B2 | 8/2012 | Kouya | |
| 8,278,141 B2 | 10/2012 | Chow et al. | |
| 8,299,494 B2 | 10/2012 | Yilmaz et al. | |
| 8,329,581 B2 | 12/2012 | Haba et al. | |
| 8,344,516 B2 | 1/2013 | Chainer | |
| 8,373,428 B2 | 2/2013 | Eldridge et al. | |
| 8,421,151 B2 | 4/2013 | Yamashita | |
| 8,525,346 B2 | 9/2013 | Rathburn | |
| 8,536,714 B2 | 9/2013 | Sakaguchi | |
| 8,610,265 B2 | 12/2013 | Rathburn | |
| 8,618,649 B2 | 12/2013 | Rathburn | |
| 8,758,067 B2 | 6/2014 | Rathburn | |
| 8,789,272 B2 | 7/2014 | Rathburn | |
| 8,803,539 B2 | 8/2014 | Rathburn | |
| 8,829,671 B2 | 9/2014 | Rathburn | |
| 2001/0012707 A1 | 8/2001 | Ho et al. | |
| 2001/0016551 A1 | 8/2001 | Yushio et al. | |
| 2002/0011639 A1 | 1/2002 | Carlson et al. | |
| 2002/0027441 A1 | 3/2002 | Akram et al. | |
| 2002/0062200 A1 | 5/2002 | Mori et al. | |
| 2002/0079912 A1 | 6/2002 | Shahriari et al. | |
| 2002/0088116 A1 | 7/2002 | Milkovich et al. | |
| 2002/0098740 A1 | 7/2002 | Ooya | |
| 2002/0105080 A1 | 8/2002 | Speakman | |
| 2002/0105087 A1 | 8/2002 | Forbes et al. | |
| 2002/0160103 A1 | 10/2002 | Fukunaga et al. | |
| 2003/0003779 A1 | 1/2003 | Rathburn | |
| 2003/0114029 A1 | 6/2003 | Lee et al. | |
| 2003/0117161 A1 | 6/2003 | Burns | |
| 2003/0156400 A1 | 8/2003 | Dibene et al. | |
| 2003/0162418 A1 | 8/2003 | Yamada | |
| 2003/0164548 A1* | 9/2003 | Lee | 257/738 |
| 2003/0188890 A1 | 10/2003 | Bhatt et al. | |
| 2003/0189083 A1* | 10/2003 | Olsen | 228/115 |
| 2003/0231819 A1 | 12/2003 | Palmer et al. | |
| 2004/0016995 A1 | 1/2004 | Kuo et al. | |
| 2004/0029411 A1 | 2/2004 | Rathburn | |
| 2004/0048523 A1 | 3/2004 | Huang et al. | |
| 2004/0054031 A1 | 3/2004 | Jacobson | |
| 2004/0070042 A1 | 4/2004 | Lee et al. | |
| 2004/0077190 A1 | 4/2004 | Huang et al. | |
| 2004/0174180 A1 | 9/2004 | Fukushima et al. | |
| 2004/0183557 A1 | 9/2004 | Akram | |
| 2004/0184219 A1 | 9/2004 | Otsuka et al. | |
| 2004/0217473 A1 | 11/2004 | Shen | |
| 2004/0243348 A1 | 12/2004 | Minatani | |
| 2005/0048680 A1 | 3/2005 | Matsunami | |
| 2005/0100294 A1 | 5/2005 | Nguyen et al. | |
| 2005/0101164 A1 | 5/2005 | Rathburn | |
| 2005/0162176 A1* | 7/2005 | Bucksch | 324/754 |
| 2005/0164527 A1 | 7/2005 | Radza et al. | |
| 2005/0253610 A1* | 11/2005 | Cram | 324/754 |
| 2006/0001152 A1 | 1/2006 | Hu | |
| 2006/0006534 A1 | 1/2006 | Yean et al. | |
| 2006/0012966 A1 | 1/2006 | Chakravorty | |
| 2006/0024924 A1 | 2/2006 | Haji et al. | |
| 2006/0044357 A1 | 3/2006 | Anderson | |
| 2006/0087064 A1 | 4/2006 | Daniel et al. | |
| 2006/0125500 A1* | 6/2006 | Watkins et al. | 324/754 |
| 2006/0149491 A1 | 7/2006 | Flach et al. | |
| 2006/0157103 A1 | 7/2006 | Sheats et al. | |
| 2006/0160379 A1 | 7/2006 | Rathburn | |
| 2006/0186906 A1 | 8/2006 | Bottoms et al. | |
| 2006/0208230 A1 | 9/2006 | Cho et al. | |
| 2006/0258912 A1 | 11/2006 | Belson et al. | |
| 2006/0261827 A1 | 11/2006 | Cooper et al. | |
| 2006/0265919 A1 | 11/2006 | Huang | |
| 2006/0281303 A1 | 12/2006 | Trezza et al. | |
| 2007/0021002 A1 | 1/2007 | Laurx et al. | |
| 2007/0059901 A1 | 3/2007 | Majumdar et al. | |
| 2007/0145981 A1 | 6/2007 | Tomita et al. | |
| 2007/0148822 A1 | 6/2007 | Haba et al. | |
| 2007/0170595 A1 | 7/2007 | Sinha | |
| 2007/0182431 A1 | 8/2007 | Komatsu et al. | |
| 2007/0201209 A1* | 8/2007 | Francis et al. | 361/704 |
| 2007/0221404 A1 | 9/2007 | Das et al. | |
| 2007/0224735 A1* | 9/2007 | Karashima et al. | 438/128 |
| 2007/0232059 A1 | 10/2007 | Abe | |
| 2007/0259539 A1 | 11/2007 | Brown et al. | |
| 2007/0267138 A1 | 11/2007 | White et al. | |
| 2007/0269999 A1 | 11/2007 | Di Stefano | |
| 2007/0273394 A1 | 11/2007 | Tanner et al. | |
| 2007/0287304 A1* | 12/2007 | Eldridge | 439/69 |
| 2007/0289127 A1 | 12/2007 | Hurwitz et al. | |
| 2007/0296090 A1 | 12/2007 | Hembree | |
| 2008/0008822 A1 | 1/2008 | Kowalski | |
| 2008/0020566 A1 | 1/2008 | Egitto et al. | |
| 2008/0041822 A1 | 2/2008 | Wang | |
| 2008/0057753 A1 | 3/2008 | Rathburn et al. | |
| 2008/0060838 A1 | 3/2008 | Chen et al. | |
| 2008/0073110 A1 | 3/2008 | Shioga et al. | |
| 2008/0093115 A1 | 4/2008 | Lee | |
| 2008/0115961 A1 | 5/2008 | Mok et al. | |
| 2008/0143358 A1 | 6/2008 | Breinlinger | |
| 2008/0143367 A1 | 6/2008 | Chavineau-Lovgren | |
| 2008/0157361 A1 | 7/2008 | Wood et al. | |
| 2008/0182436 A1 | 7/2008 | Rathburn | |
| 2008/0185180 A1 | 8/2008 | Cheng et al. | |
| 2008/0197867 A1 | 8/2008 | Wokhlu et al. | |
| 2008/0220584 A1 | 9/2008 | Kim et al. | |
| 2008/0241997 A1 | 10/2008 | Sunohara et al. | |
| 2008/0246136 A1 | 10/2008 | Haba et al. | |
| 2008/0248596 A1 | 10/2008 | Das et al. | |
| 2008/0250363 A1 | 10/2008 | Goto et al. | |
| 2008/0265919 A1 | 10/2008 | Izadian | |
| 2008/0290885 A1 | 11/2008 | Matsunami | |
| 2008/0309349 A1* | 12/2008 | Sutono | 324/537 |
| 2009/0058444 A1 | 3/2009 | Mcintyre | |
| 2009/0061089 A1 | 3/2009 | King | |
| 2009/0065918 A1 | 3/2009 | Murphy | |
| 2009/0127698 A1* | 5/2009 | Rathburn | 257/698 |
| 2009/0133906 A1 | 5/2009 | Baek | |
| 2009/0158581 A1 | 6/2009 | Nguyen et al. | |
| 2009/0180236 A1* | 7/2009 | Lee et al. | 361/301.4 |
| 2009/0224404 A1 | 9/2009 | Wood et al. | |
| 2009/0241332 A1 | 10/2009 | Lauffer et al. | |
| 2009/0267628 A1 | 10/2009 | Takase | |
| 2009/0321915 A1 | 12/2009 | Hu et al. | |
| 2010/0022105 A1 | 1/2010 | Di Stefano | |
| 2010/0133680 A1 | 6/2010 | Kang et al. | |
| 2010/0143194 A1 | 6/2010 | Lee et al. | |
| 2010/0213960 A1 | 8/2010 | Mok et al. | |

(56) References Cited

U.S. PATENT DOCUMENTS

| | | | |
|---|---|---|---|
| 2010/0300734 A1 | 12/2010 | Ables et al. | |
| 2011/0083881 A1 | 4/2011 | Nguyen et al. | |
| 2011/0101540 A1 | 5/2011 | Chainer | |
| 2012/0017437 A1 | 1/2012 | Das et al. | |
| 2012/0043119 A1 | 2/2012 | Rathburn | |
| 2012/0043130 A1 | 2/2012 | Rathburn | |
| 2012/0043667 A1 | 2/2012 | Rathburn | |
| 2012/0044659 A1 | 2/2012 | Rathburn | |
| 2012/0049342 A1 | 3/2012 | Rathburn | |
| 2012/0049877 A1 | 3/2012 | Rathburn | |
| 2012/0051016 A1 | 3/2012 | Rathburn | |
| 2012/0055701 A1 | 3/2012 | Rathburn | |
| 2012/0055702 A1* | 3/2012 | Rathburn | 174/254 |
| 2012/0056332 A1* | 3/2012 | Rathburn | 257/774 |
| 2012/0058653 A1* | 3/2012 | Rathburn | 439/76.1 |
| 2012/0061846 A1 | 3/2012 | Rathburn | |
| 2012/0061851 A1 | 3/2012 | Rathburn | |
| 2012/0062270 A1 | 3/2012 | Rathburn | |
| 2012/0068727 A1 | 3/2012 | Rathburn | |
| 2012/0161317 A1 | 6/2012 | Rathburn | |
| 2012/0164888 A1 | 6/2012 | Rathburn | |
| 2012/0168948 A1 | 7/2012 | Rathburn | |
| 2012/0171907 A1 | 7/2012 | Rathburn | |
| 2012/0182035 A1 | 7/2012 | Rathburn | |
| 2012/0199985 A1 | 8/2012 | Rathburn | |
| 2012/0202364 A1 | 8/2012 | Rathburn | |
| 2012/0244728 A1 | 9/2012 | Rathburn | |
| 2012/0252164 A1 | 10/2012 | Nakao et al. | |
| 2012/0257343 A1 | 10/2012 | Das et al. | |
| 2012/0268155 A1 | 10/2012 | Rathburn | |
| 2013/0078860 A1 | 3/2013 | Rathburn | |
| 2013/0105984 A1 | 5/2013 | Rathburn | |
| 2013/0203273 A1 | 8/2013 | Rathburn | |
| 2013/0206468 A1 | 8/2013 | Rathburn | |
| 2013/0210276 A1 | 8/2013 | Rathburn | |
| 2013/0223034 A1 | 8/2013 | Rathburn | |
| 2013/0244490 A1 | 9/2013 | Rathburn | |
| 2013/0330942 A1 | 12/2013 | Rathburn | |
| 2014/0043782 A1 | 2/2014 | Rathburn | |
| 2014/0080258 A1 | 3/2014 | Rathburn | |
| 2014/0192498 A1 | 7/2014 | Rathburn | |
| 2014/0220797 A1 | 8/2014 | Rathburn | |
| 2014/0225255 A1 | 8/2014 | Rathburn | |
| 2014/0242816 A1 | 8/2014 | Rathburn | |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |

OTHER PUBLICATIONS

Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.

(56) References Cited

OTHER PUBLICATIONS

Response to Restriction Requirement filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Notification of Transmittal of the International Search Report and the Written Opinion of the International Searching Authority issued Jul. 30, 2010 in International Application No. PCT/US2010/036043.
Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Authority issued Sep. 27, 2011 in International Application No. PCT/US2011/038845.
Co-pending U.S. Appl. No. 13/266,486 titled High Performance Surface Mount Electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,228, titled Singulated Semiconductor Device Separable Electrical Interconnect, filed Nov. 7, 2011.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.

(56) References Cited

OTHER PUBLICATIONS

Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Notification of Transmittal of the International Search Report and the Written Opinion of the International Searching Authority mailed Nov. 29, 2012 in International Application No. PCT/US2012/053848.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Co-pending U.S. Appl. No. 13/575,368, titled High Speed Backplane Connector, filed Jul. 26, 2012.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Notification of Transmittal of the International Search Report and the Written Opinion of the International Searching Authority mailed Feb. 8, 2012 in International Application No. PCT/US2011/0.
Notification of Transmittal of the International Search Report and the Written Opinion of the International Searching Authority mailed Mar. 26, 2012 in International Application No. PCT/US2011/062313.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-To-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.

(56) References Cited

OTHER PUBLICATIONS

Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Print—Definition of Print by the Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/319,120, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Notification of Transmittal of the International Search Report and the Written Opinion of the International Searching Authority mailed Oct. 27, 2014 in International Application No. PCT/US2014/045856.
Ex Parte Quayle Action mailed Oct. 1, 2014 in co-pending U.S. Appl. No. 13/266,486, now published as US Patent Application Publication No. US 2012/0055701.

(56) References Cited

OTHER PUBLICATIONS

Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.

Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.

(56) References Cited

OTHER PUBLICATIONS

Final Office Action mailed Feb. 14, 2014 in co-pending U.S. Appl. No. 13/413,724, now published as US Patent Application Publication No. US 2012/0168948.

Amendment and Response to Final Office filed Feb. 26, 2014 in co-pending U.S. Appl. No. 13/413,724, now published as US Patent Application Publication No. US 2012/0168948.

Amendment and Response to Final Office filed Dec. 30, 2013 in co-pending U.S. Appl. No. 13/969,953, now published as US Patent Application Publication No. US 2013/0330942.

Notice of Allowance and Fee(s) Due mailed Jan. 22, 2014 in co-pending U.S. Appl. No. 13/969,953, now published as US Patent Application Publication No. US 2013/0330942.

Co-pending U.S. Appl. No. 14/238,638 titled Direct Metalization of Electrical Circuit Structure, filed Feb. 12, 2014.

\* cited by examiner

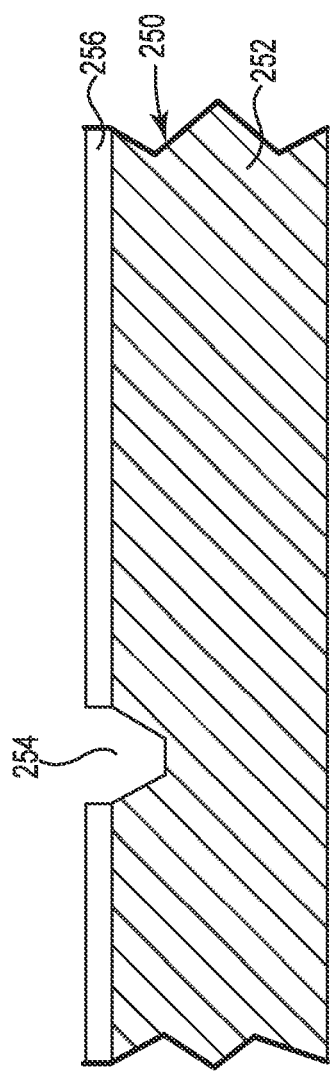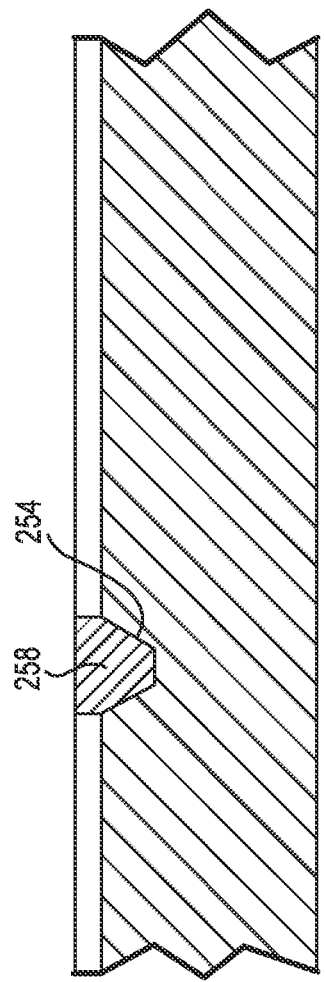
Fig. 11
Fig. 12

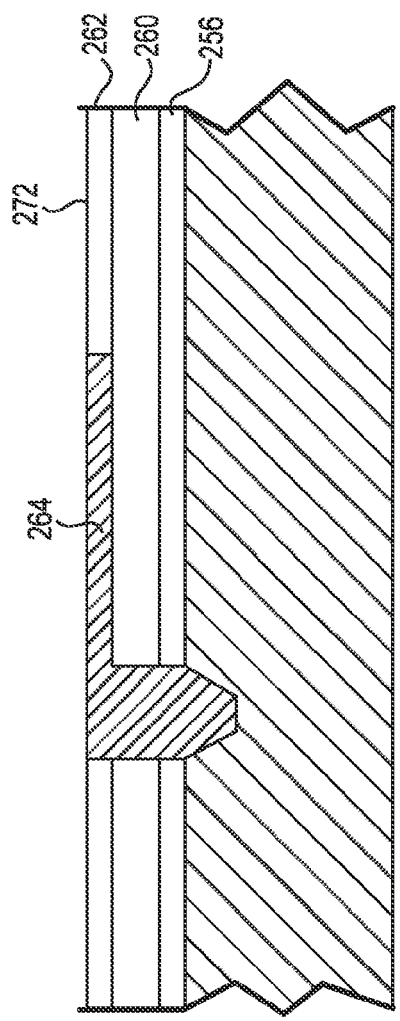
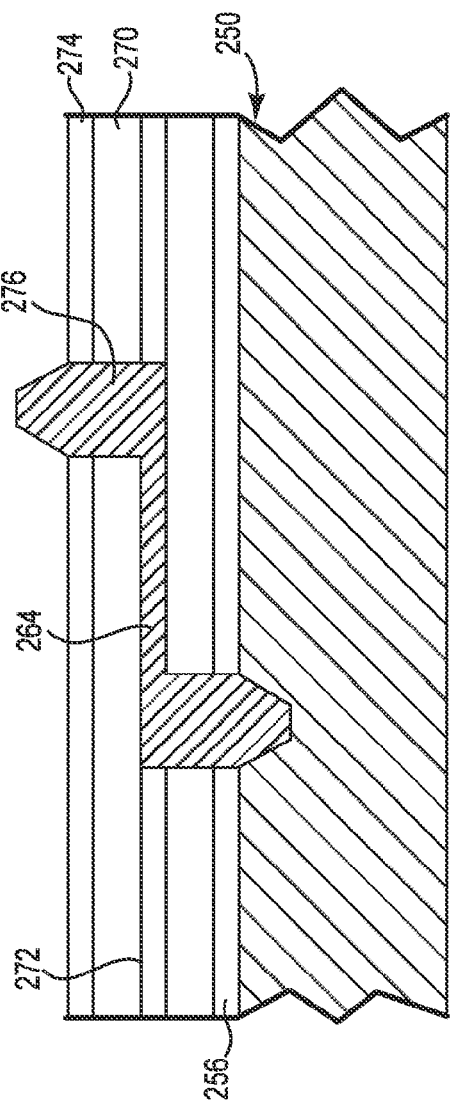

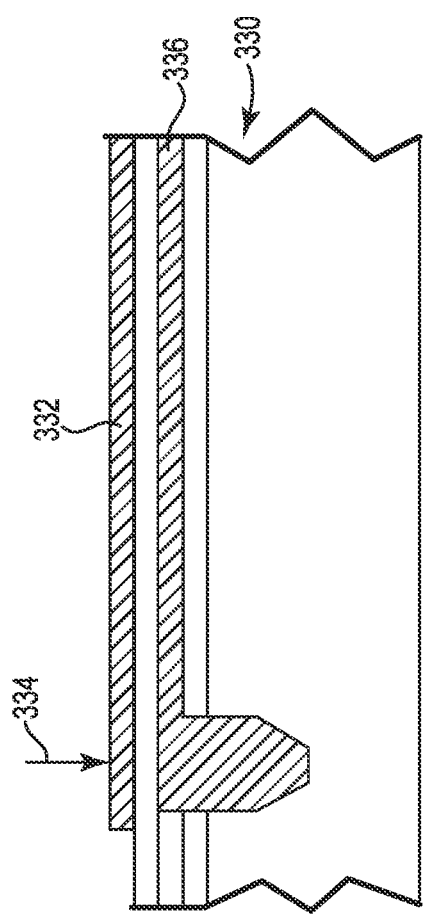

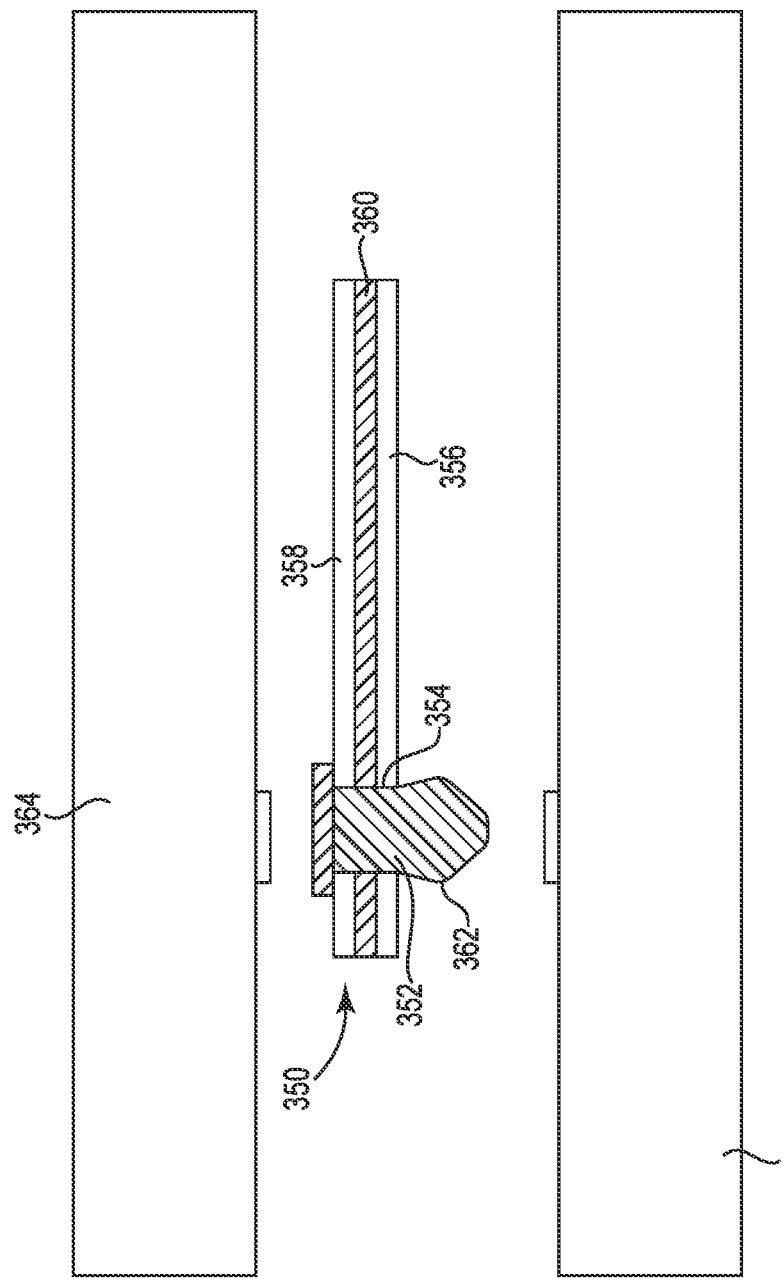

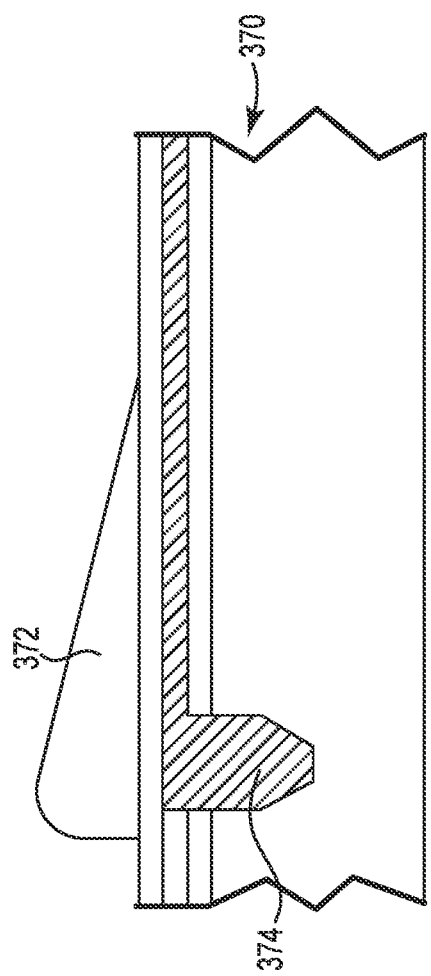

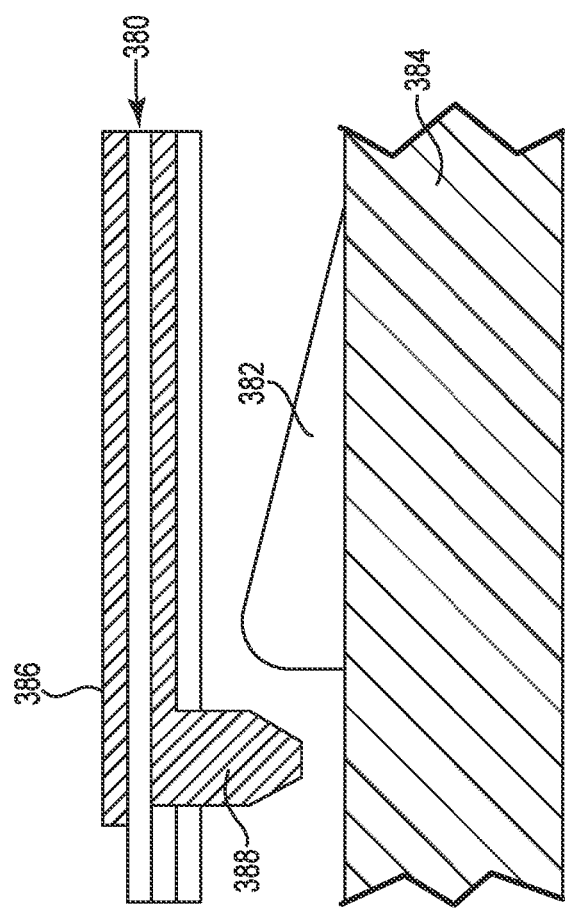

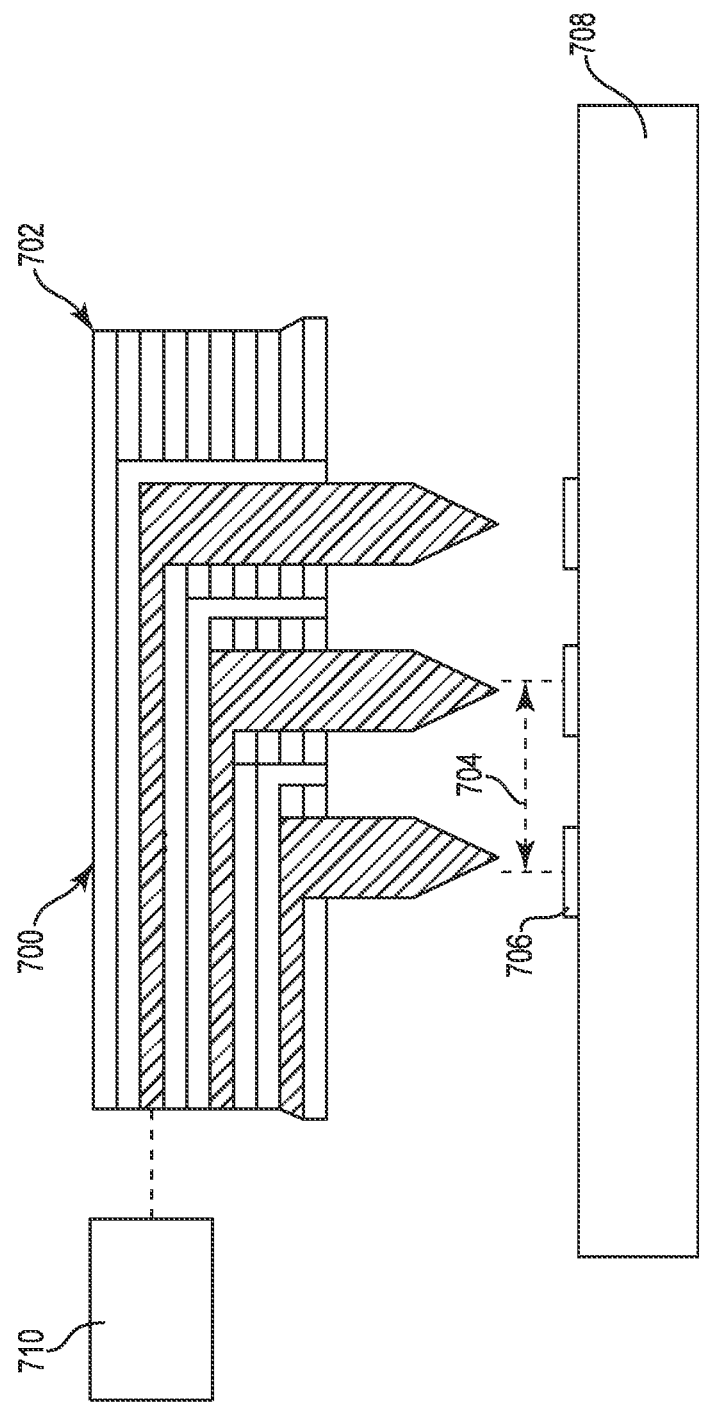

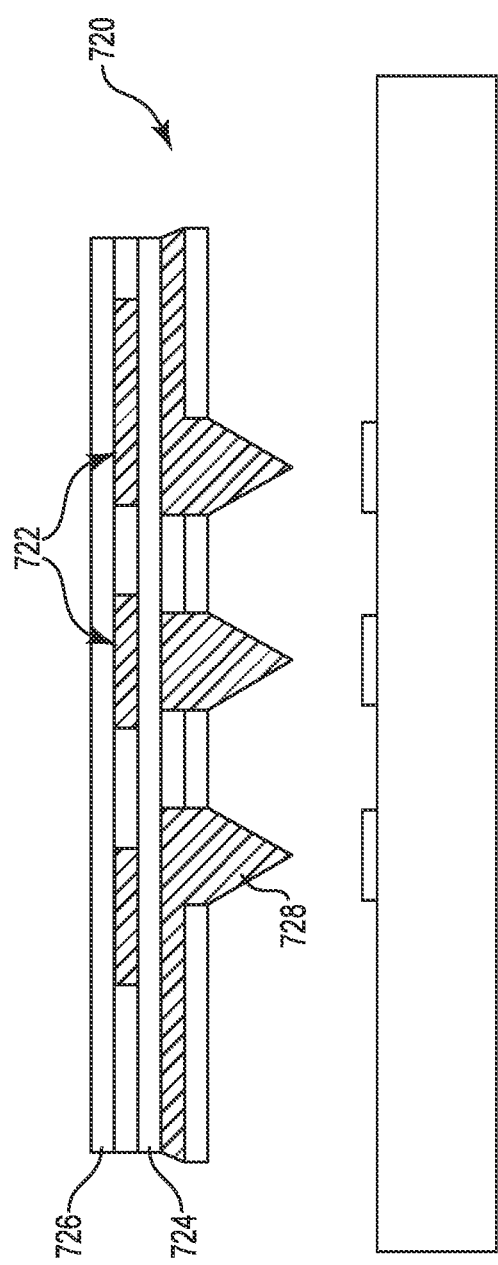

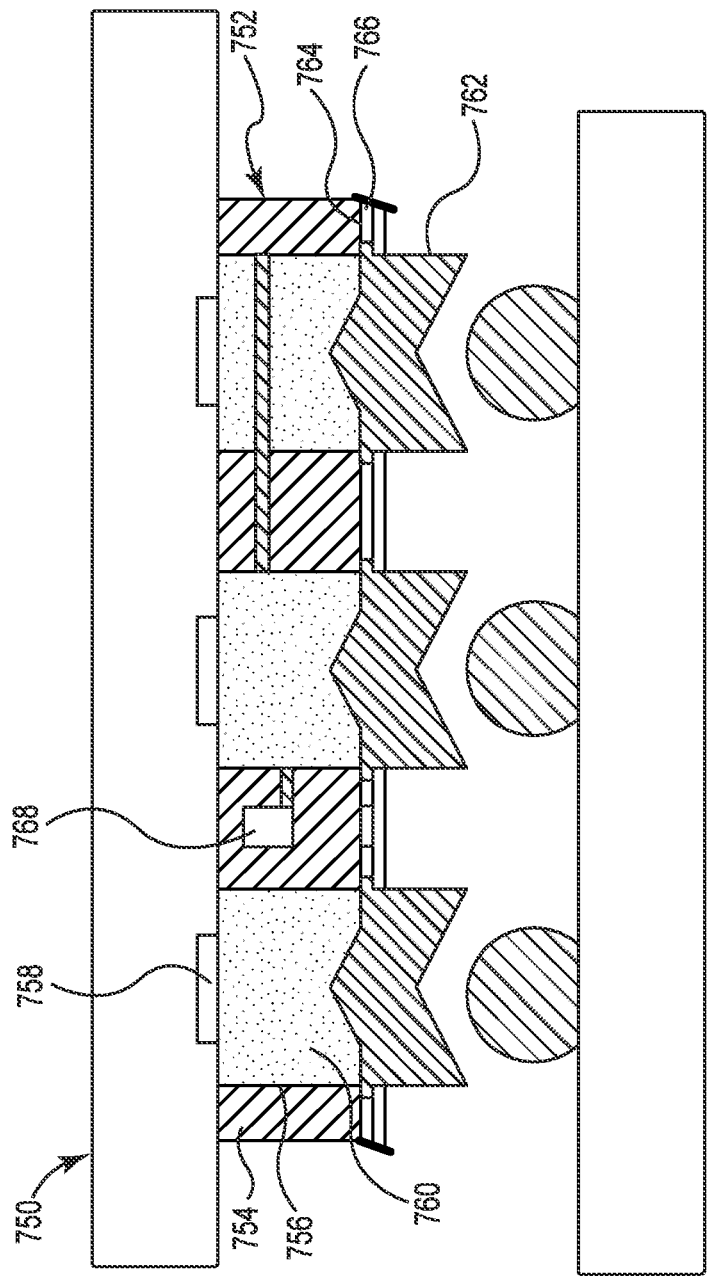

COMPLIANT PRINTED CIRCUIT SEMICONDUCTOR TESTER INTERFACE

TECHNICAL FIELD

The present application relates to a high performance compliant printed circuit semiconductor tester interface that merges the long-term performance advantages of flexible circuits, with the flexibility of additive printing technology.

BACKGROUND OF THE INVENTION

Traditional printed circuits are often constructed in what is commonly called rigid or flexible formats. The rigid versions are used in nearly every electronic system, where the printed circuit board (PCB) is essentially a laminate of materials and circuits that when built is relatively stiff or rigid and cannot be bent significantly without damage.

Flexible circuits have become very popular in many applications where the ability to bend the circuit to connect one member of a system to another has some benefit. These flexible circuits are made in a very similar fashion as rigid PCB's, where layers of circuitry and dielectric materials are laminated. The main difference is the material set used for construction. Typical flexible circuits start with a polymer film that is clad, laminated, or deposited with copper. A photolithography image with the desired circuitry geometry is printed onto the copper, and the polymer film is etched to remove the unwanted copper. Flexible circuits are very commonly used in many electronic systems such as notebook computers, medical devices, displays, handheld devices, autos, aircraft and many others.

Flexible circuits are processed similar to that of rigid PCB's with a series of imaging, masking, drilling, via creation, plating, and trimming steps. The resulting circuit can be bent, without damaging the copper circuitry. Flexible circuits are solderable, and can have devices attached to provide some desired function. The materials used to make flexible circuits can be used in high frequency applications where the material set and design features can often provide better electrical performance than a comparable rigid circuit.

Flexible circuits are connected to electrical system in a variety of ways. In most cases, a portion of the circuitry is exposed to create a connection point. Once exposed, the circuitry can be connected to another circuit or component by soldering, conductive adhesive, thermosonic welding, pressure or a mechanical connector. In general, the terminals are located on an end of the flexible circuit, where edge traces are exposed or in some cases an area array of terminals are exposed. Often there is some sort of mechanical enhancement at or near the connection to prevent the joints from being disconnected during use or flexure. In general, flexible circuits are expensive compared to some rigid PCB products. Flexible circuits also have some limitations regarding layer count or feature registration, and are therefore generally only used for small or elongated applications.

Tester interface circuit boards are typically specialty versions of traditional rigid PCBs. Tester interface board are often very thick, with many layers required to provide the required connections to the tester.

One type of tester interface circuit board is a Device Under Test (DUT) or Load Board, which are typically fabricated to accept a test socket or contactor on the top surface, and have a series of land grid array pads on the under surface that mate with a field of spring probes that are mated with the tester electronics. For wafer probing applications, a similar scenario is established, where the tester interface PCB often includes a probe card assembly. In some probe applications, a space transformer is used to transition or redistribute the fine terminal pitch of the wafer probe to the larger pitch required for connection with the tester.

In general, tester interface circuits boards, space transformers, and probe cards can be very expensive compared to higher volume PCBs, and often have long lead times. In many cases, the tester interface circuit boards and probe cards are specific to a particular electrical device and cannot be used for testing other electrical devices.

BRIEF SUMMARY OF THE INVENTION

The present disclosure is directed to high performance tester interfaces made using additive printing technology. The nature of the additive printing process provides the potential for significant enhancement to traditional printed circuit techniques used to produce tester interfaces. In some embodiments, the present tester interface merges a test socket and/or probe function directly into the tester interface. Consequently, the entire tester interface is a consumable item with lower overall cost and less lead-time.

The additive printing processes enable printing of internal and/or external compliance to enhance the mechanical performance of the present compliant tester interface, as well as a host of electrical devices. Electrical devices are preferably printed on the tester interface, such as for example, ground planes, power planes, transistors, capacitors, resistors, RF antennae, shielding, filters, signal or power altering and enhancing devices, memory devices, embedded IC, and the like.

The present tester interface can be produced digitally, without tooling or costly artwork. The tester interface tester interface can be produced as a "Green" product, with dramatic reductions in environmental issues related to the production of conventional flexible circuits. By adding or arranging metallic particles, conductive inks, plating, or portions of traditional alloys, the present tester interface reduces parasitic electrical effects and impedance mismatch, potentially increasing the current carrying capacity.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

One embodiment is directed to a compliant printed circuit semiconductor tester interface that provides a temporary interconnect between terminals on integrated circuit (IC) devices being tested. The compliant printed circuit semiconductor tester interface includes at least one dielectric layer printed with recesses corresponding to a target circuit geometry. A conductive material is deposited in at least a portion of the recesses comprising a circuit geometry and a plurality of first contact pads accessible along a first surface. At least one dielectric covering layer is preferably applied over the circuit geometry. A plurality of openings in the dielectric covering layer are provided to permit electrical coupling of terminals on the IC device and the first contact pads. Testing electronics that to test electrical functions of the IC device are electrically coupled to the circuit geometry.

One or more compliant layers are optionally positioned to bias a plurality of the first contact pads against the terminals on the IC device. At least one electrical device can be located on the compliant printed circuit and electrically coupled to the circuit geometry. The electrical devices may include at least a portion of the testing electronics. In one embodiment, an electrical device is printed on one of the dielectric layers. The electrical device can be selected from one of shielding, near device decoupling, capacitors, transistors, resistors, filters, signal or power altering and enhancing devices, memory devices, embedded IC devices, RF antennae, and the like.

In another embodiment, a socket housing is coupled to the compliant printed circuit. The first contact pads are positioned in a socket housing recess sized to receive the IC device.

The conductive material can be one of sintered conductive particles or a conductive ink. In another embodiment, optical quality materials are deposited in at least a portion of the recesses to create one or more optical circuit geometries. One or more optical fibers can also be located in at least a portion of the recesses.

The first contact pads can optionally extend above the dielectric covering layer. The first contact pads can be probe members of a probe assembly. The compliant printed circuit can also be singulated adjacent at least one of the first contact pads.

The conductive traces in the circuit geometry are preferably substantially rectangular cross-sectional shapes. The printing technology permits a single layer to include conductive materials, non-conductive materials, and semi-conductive materials.

The compliant printed circuit can optionally extend beyond the dielectric covering layer to form an edge connector. At least one additional circuitry plane can be added to the compliant printed circuit. In another embodiment, a plurality of second contact pads accessible along a second surface of the compliant printed circuit are provided to electrically couple with the testing electronics.

The present disclosure is also directed to a method of making a compliant printed circuit semiconductor tester interface that provides a temporary interconnect between terminals on an integrated circuit (IC) device being tested. The method includes printing at least one dielectric layer with recesses corresponding to a target circuit geometry. A conductive material is printed in at least a portion of the recesses to create a circuit geometry and a plurality of first contact pads accessible along a first surface of the compliant printed circuit. At least one dielectric covering layer is preferably printed with a plurality of openings adapted to permit electrical coupling of terminals on the IC device and the first contact pads. Testing electronics is electrically coupled to test electrical functions of the IC device to the circuit geometry.

In one embodiment, pre-formed conductive trace materials are located in the recesses. The recesses are than plated to form conductive traces with substantially rectangular cross-sectional shapes. In another embodiment, a conductive foil is pressed into at least a portion of the recesses. The conductive foil is sheared along edges of the recesses. The excess conductive foil not located in the recesses is removed and the recesses are plated to form conductive traces with substantially rectangular cross-sectional shapes.

At least one electrical device is optionally printed on a dielectric layer and electrically coupled to at least a portion of the circuit geometry. Optical quality materials can be printed or deposited in at least a portion of the recesses to form optical circuit geometries. Alternatively, optical fibers can be located in the recesses.

The present compliant printed circuit tester interface can serve as a platform to add passive and active circuit features to improve electrical performance or internal function and intelligence. For example, electrical features and devices are printed onto the compliant printed circuit. The compliant printed circuit tester interface can also be configured with conductive traces that reduce or redistribute the terminal pitch, without the addition of an interposer or daughter substrate. Grounding schemes, shielding, electrical devices, and power planes can be added to the interconnect assembly, reducing the number of connections to the PCB and relieving routing constraints while increasing performance.

BRIEF DESCRIPTION OF THE SEVERAL VIEWS OF THE DRAWING

FIG. 11 illustrates an alternate method of making a compliant printed circuit semiconductor tester interface in accordance with an embodiment of the present disclosure.

FIG. 12 illustrates a metalization step of the method of FIG. 11.

FIG. 13 illustrates a compliant printed circuit semiconductor tester interface made in accordance with the method of FIGS. 11 and 12.

FIG. 14 illustrates an alternate compliant printed circuit semiconductor tester interface in accordance with an embodiment of the present disclosure.

FIG. 15 illustrates an alternate compliant printed circuit semiconductor tester interface with a compliant structure in accordance with an embodiment of the present disclosure.

FIG. 16 illustrates an alternate compliant printed circuit semiconductor tester interface with a male contact member in accordance with an embodiment of the present disclosure.

FIG. 17 illustrates an alternate compliant printed circuit semiconductor tester interface with a printed compliant member in accordance with an embodiment of the present disclosure.

FIG. 18 illustrates an alternate compliant printed circuit semiconductor tester interface with a printed compliant member in accordance with an embodiment of the present disclosure.

FIG. 29 is a cross-sectional view of a multi-layered probe assembly incorporated into a compliant printed circuit semiconductor tester interface in accordance with an embodiment of the present disclosure.

FIG. 30 is a cross-sectional view of a probe assembly with capacitive coupling features incorporated into a compliant printed circuit semiconductor tester interface in accordance with an embodiment of the present disclosure.

FIG. 31 illustrates a compliant conductive interconnect incorporated into a compliant printed circuit semiconductor tester interface in accordance with an embodiment of the present disclosure.

DETAILED DESCRIPTION OF THE INVENTION

Figure 1:
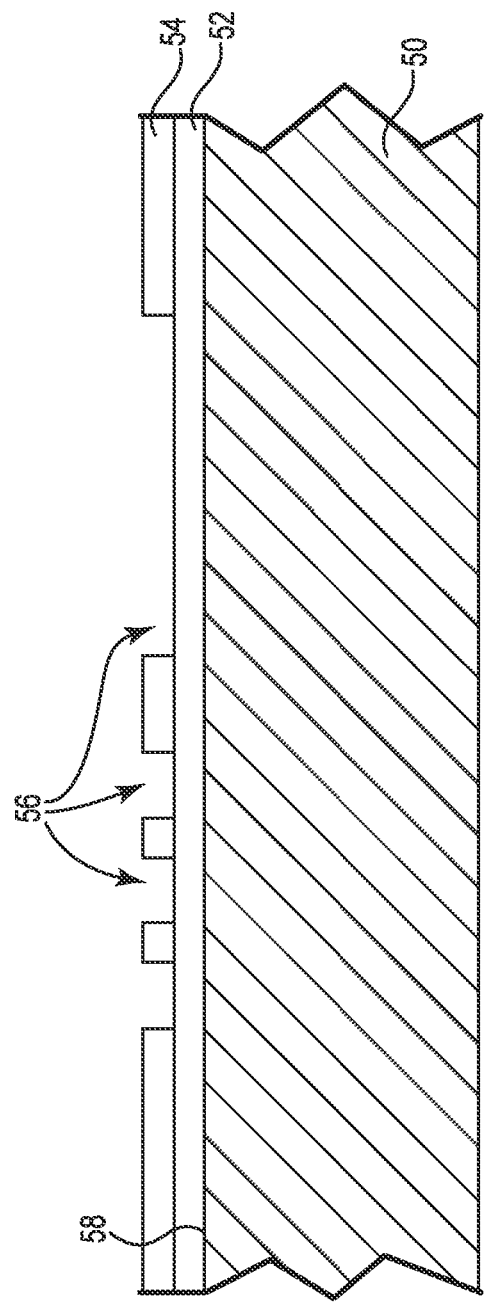
FIG. 1 is a cross-sectional view of a method of making a compliant printed circuit semiconductor tester interface in accordance with an embodiment of the present disclosure.

FIG. 1 is a side cross-sectional view of a method for replicating a compliant printed circuit for a semiconductor tester interface using additive processes in accordance with an embodiment of the present disclosure. Substrate 50 is a platform for the fabrication process, but may also be used in the finished tester interface.

One or more dielectric layers 52, 54 are preferably printed on surface 58 of the substrate 50 to create recesses 56 corresponding to a desired circuit geometry. Alternatively, the recesses 56 can be defined by embossing, imprinting, chemical etching with a printed mask, or a variety of other techniques. A number of different materials are used as the substrate 50 including: polyester (PET), polyimide (PI), polyethylene napthalate (PEN), Polyetherimide (PEI), along with various fluropolymers (FEP) and copolymers. Polyimide films are the most prevalent due to their advantageous electrical, mechanical, chemical, and thermal properties.

Figure 2:
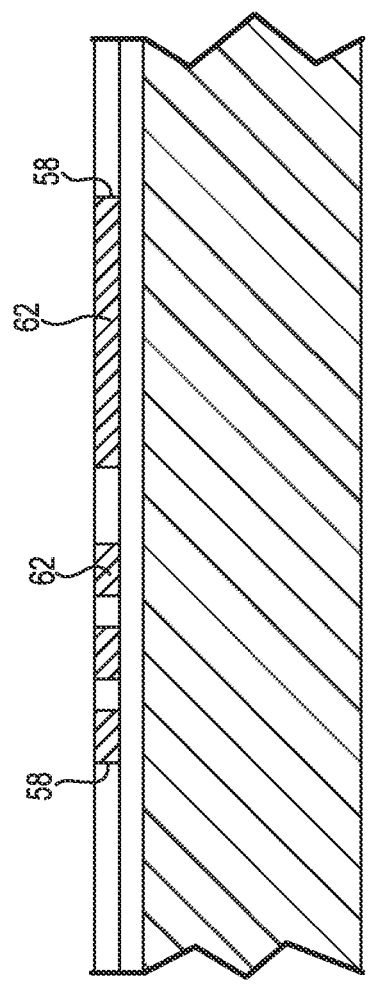
FIG. 2 illustrates a circuit geometry on the compliant printed circuit semiconductor tester interface of FIG. 1.

As illustrated in FIG. 2, metalizing material is deposited in the recesses 56 to create conductive traces and circuit geometry 62. Metalizing can be performed by printing conductive particles followed by a sintering step, by printing conductive inks, or a variety of other techniques. The resulting metalized layer is preferably plated to improve conductive properties. The circuit geometry 62 is preferably of copper or similar metallic materials such as phosphor bronze or beryllium-copper. The plating is preferably a corrosion resistant metallic material such as nickel, gold, silver, palladium, or multiple layers thereof.

Figure 3:
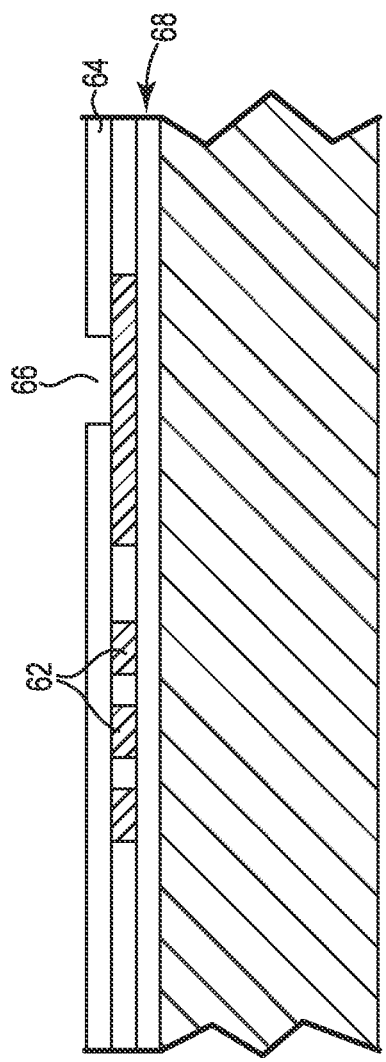
FIG. 3 illustrates the compliant printed circuit semiconductor tester interface of FIG. 1.

As illustrated in FIG. 3, another dielectric or insulating layer 64 is applied to the circuit geometry 62 and the dielectric layer 54. The nature of the printing process allows for selective application of dielectric layer 64 to leave selected portions 66 of the circuit geometry 62 expose if desired. The resulting compliant printed circuit 68 can potentially be considered entirely "green" with limited or no chemistry used to produce beyond the direct write materials.

The recesses 56 in the layers 52, 54, 64 permit control of the location, cross section, material content, and aspect ratio of the conductive traces in the circuit geometry 62. Maintaining the conductive traces of the circuit geometry 62 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 56 to control the aspect ratio of the conductive traces results in a more rectangular or square cross-section of the conductive traces in the circuit geometry 62, with the corresponding improvement in signal integrity.

In another embodiment, pre-patterned or pre-etched thin conductive foil circuit traces are transferred to the recesses 56. For example, a pressure sensitive adhesive can be used to retain the copper foil circuit traces in the recesses 56. The trapezoidal cross-sections of the pre-formed conductive foil traces are then post-plated. The plating material fills the open spaces in the recesses 56 not occupied by the foil circuit geometry, resulting in a substantially rectangular or square cross-sectional shape corresponding to the shape of the recesses 56.

In another embodiment, a thin conductive foil is pressed into the recesses 56, and the edges of the recesses 56 acts to cut or shear the conductive foil. The process locates a portion of the conductive foil in the trenches 56, but leaves the negative pattern of the conductive foil not wanted outside and above the trenches 56 for easy removal. Again, the foil in the trenches 56 is preferably post plated to add material to increase the thickness of the conductive traces in the circuit geometry 62 and to fill any voids left between the conductive foil and the recesses 56.

The dielectric layers 52, 54, 64 may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the layer 52, 54, 64 are designed to provide electrostatic dissipation or to reduce cross-talk between the traces of the circuit geometry 62. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 4:
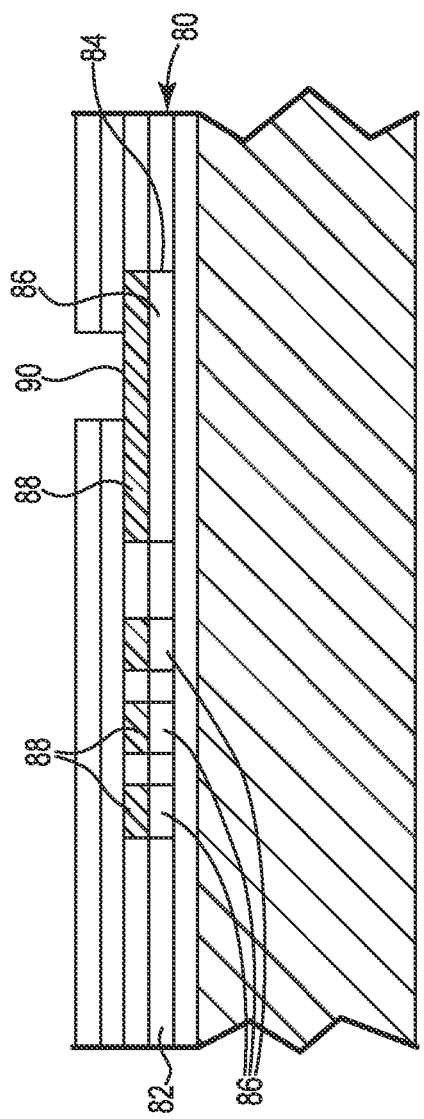
FIG. 4 illustrates a compliant printed circuit semiconductor tester interface with printed compliant features in accordance with an embodiment of the present disclosure.

FIG. 4 illustrates an alternate compliant printed circuit 80 in accordance with an embodiment of the present disclosure. Dielectric layer 82 includes openings 84 into which compliant material 86 is printed before formation of circuit geometry 88. The compliant printed material 86 improves reliability during flexure of exposed portion 90 the circuit geometry 88.

Figure 5:
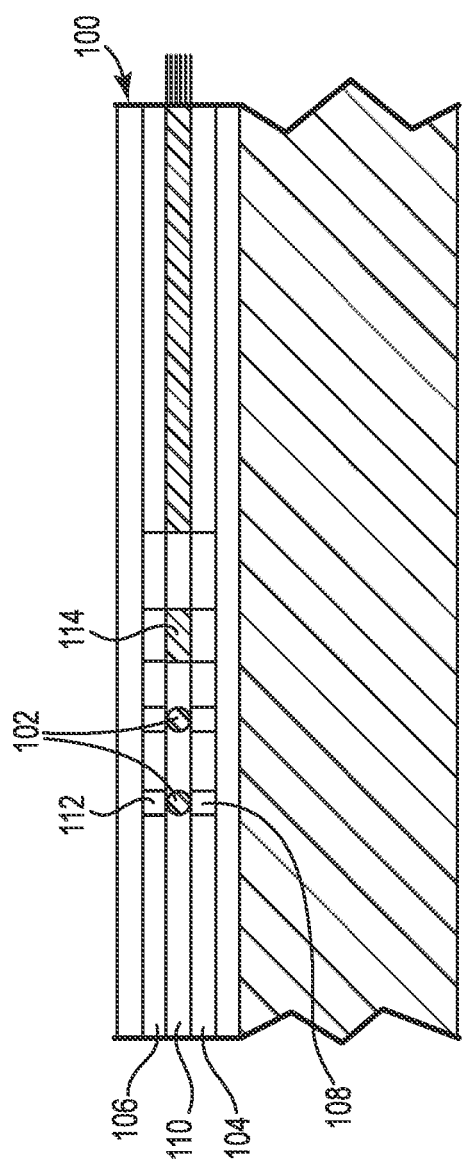
FIG. 5 illustrates a compliant printed circuit semiconductor tester interface with optical features in accordance with an embodiment of the present disclosure.

FIG. 5 illustrates an alternate compliant printed circuit 100 in accordance with an embodiment of the present disclosure. Optical fibers 102 are located between layers 104, 106 of dielectric material. In one embodiment, optical fibers 102 is positioned over printed compliant layer 108, and dielectric layer 110 is printed over and around the optical fibers 102. A compliant layer 112 is preferably printed above the optical fiber 102 as well. The compliant layers 108, 112 support the optical fibers 102 during flexure. In another embodiment, the dielectric layer 110 is formed or printed with recesses into which the optical fibers 102 are deposited.

In another embodiment, optical quality materials 114 are printed during printing of the compliant printed circuit semiconductor tester interface 100. The optical quality material 114 and/or the optical fibers 102 comprise optical circuit geometries. The printing process allows for deposition of coatings in-situ that enhance the optical transmission or reduce loss. The precision of the printing process reduces misalignment issues when the optical materials 114 are optically coupled with another optical structure.

Figure 6:
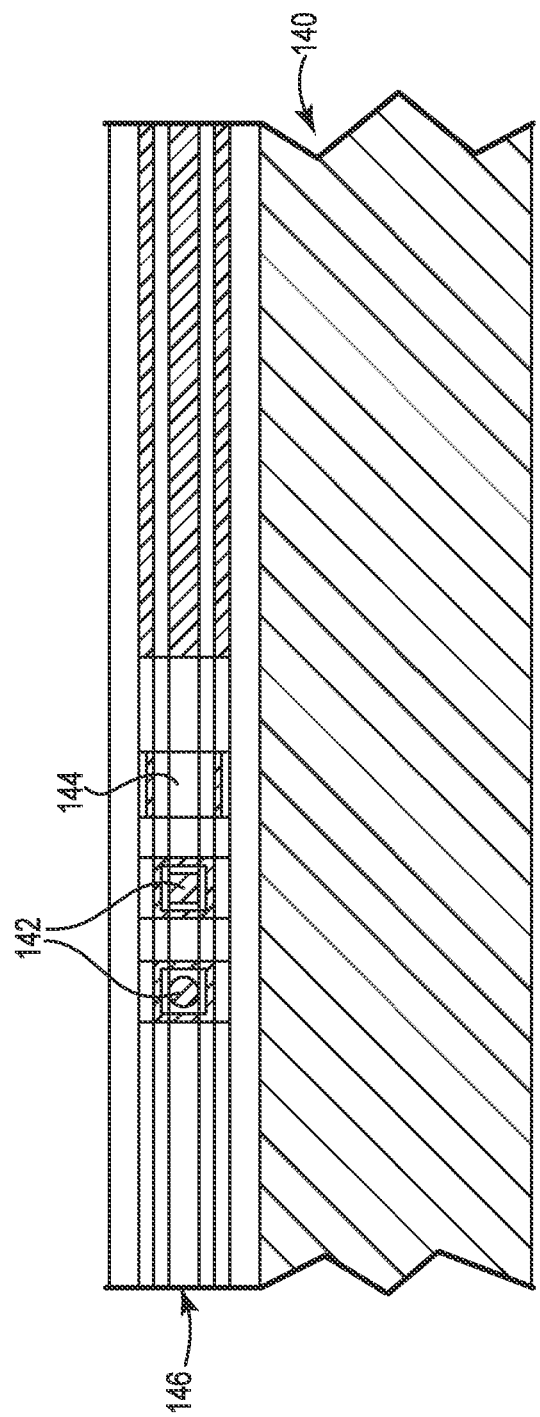
FIG. 6 illustrates an alternate compliant printed circuit semiconductor tester interface with optical features in accordance with an embodiment of the present disclosure.

FIG. 6 illustrates another embodiment of a present compliant printed circuit 140 in accordance with an embodiment of the present disclosure. Embedded coaxial RF circuits 142 or printed micro strip RF circuits 144 are located with dielectric/metal layers 146. These RF circuits 142, 144 are preferably created by printing dielectrics and metallization geometry.

Figure 7:
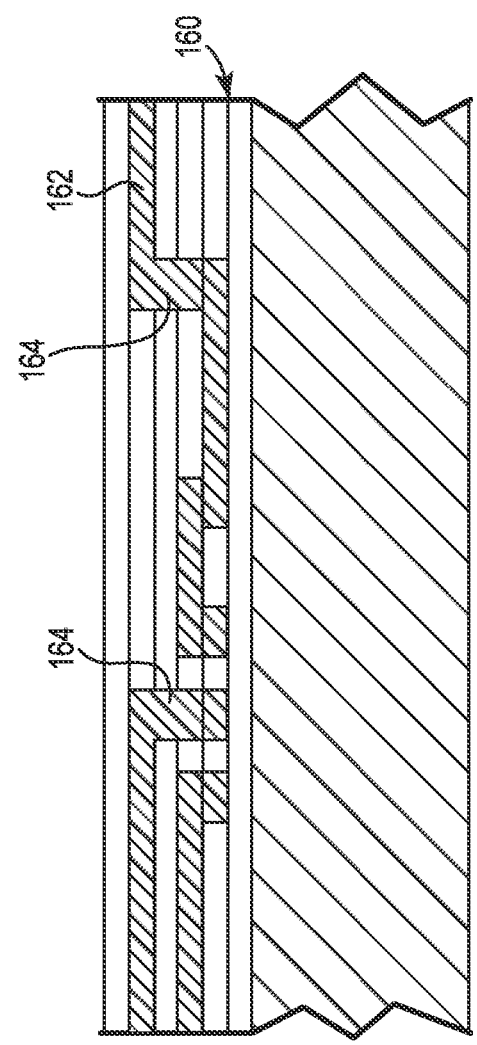
FIG. 7 illustrates an alternate compliant printed circuit semiconductor tester interface with printed vias in accordance with an embodiment of the present disclosure.

As illustrated in FIG. 7, use of additive processes allows the creation of a compliant printed circuit semiconductor tester interface 160 with inter-circuit, 3D lattice structures 162 having intricate routing schemes. Vias 164 can be printed with each layer, without drilling.

Figure 8:
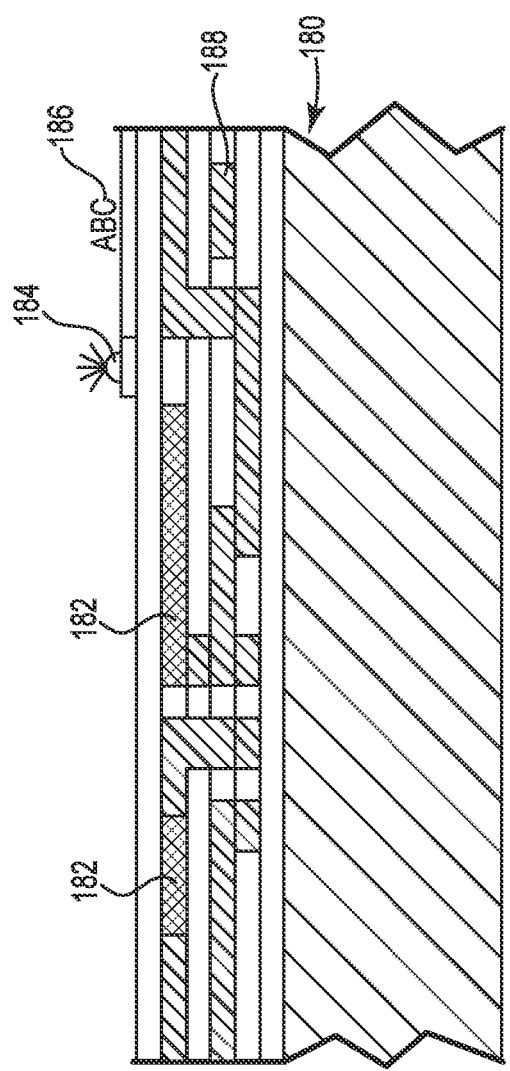
FIG. 8 illustrates an alternate compliant printed circuit semiconductor tester interface with printed electrical devices in accordance with an embodiment of the present disclosure.

FIG. 8 illustrates a compliant printed circuit semiconductor tester interface 180 with printed electrical devices 182. The electrical devices 182 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices 182 include printed LED indicator 184 and display electronics 186. Geometries can also be printed to provide capacitive coupling 188.

The electrical devices 182 are preferably printed during construction of the interconnect assembly 100. The electrical devices 182 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 182 can be formed using printing technology, adding intelligence to the compliant printed circuit semiconductor tester interface 180. Features that are typically located on other circuit members can be incorporated into the flexible circuit 180 in accordance with an embodiment of the present disclosure.

The availability of printable silicon inks provides the ability to print electrical devices 182, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 182 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member.

The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a substrate, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 9:
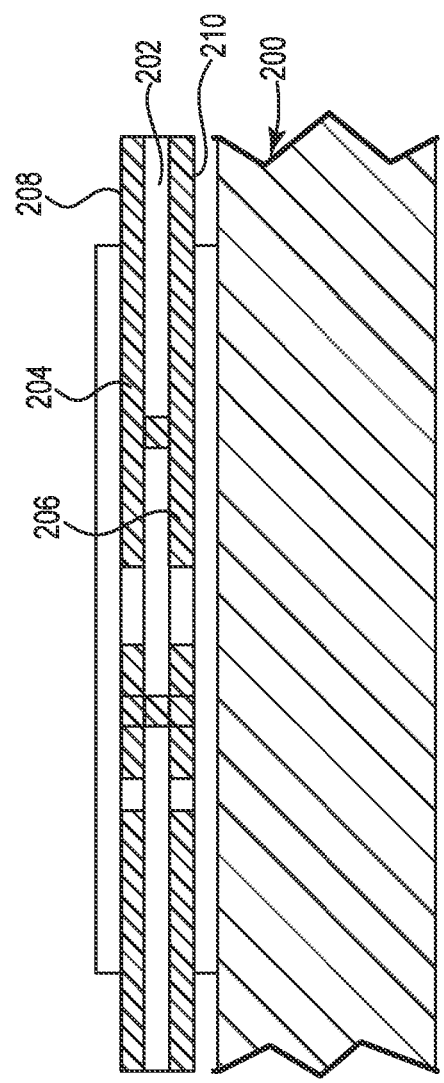
FIG. 9 illustrates an alternate compliant printed circuit semiconductor tester interface with printed compliant electrical pads to plug into another connector in accordance with an embodiment of the present disclosure.

FIG. 9 illustrates an alternate compliant printed circuit semiconductor tester interface 200 with printed compliant material 202 added between circuit geometries 204, 206 to facilitate insertion of exposed circuit geometries 208, 210 into a receptacle or socket. The compliant material 202 can supplement or replace the compliance in the receptacle or socket. In one embodiment, the compliance is provided by a combination of the compliant material 202 and the exposed circuit geometries 208, 210.

Figure 10:
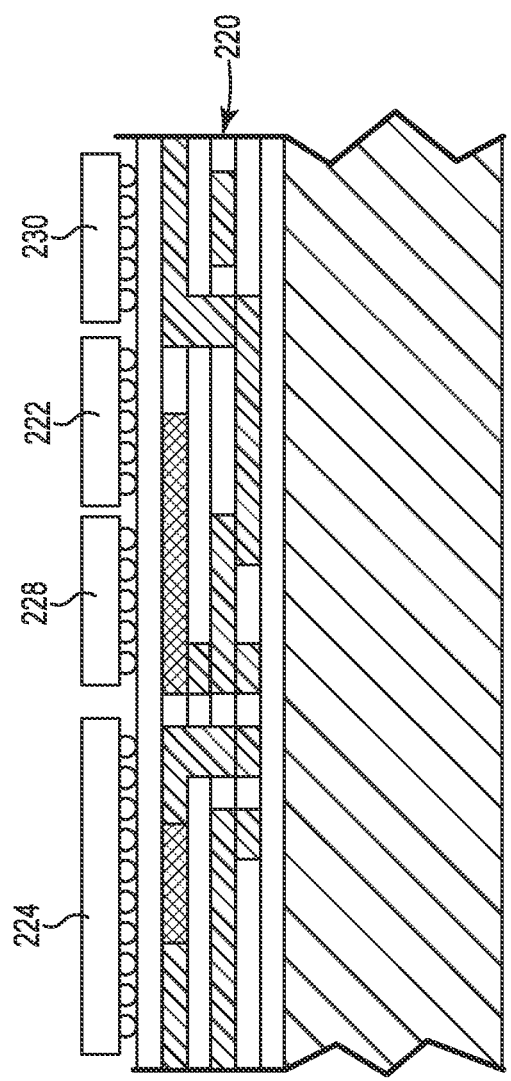
FIG. 10 illustrates a compliant printed circuit semiconductor tester interface in accordance with an embodiment of the present disclosure.

FIG. 10 illustrates a compliant printed circuit tester interface 220 with tester electronics added in accordance with an embodiment of the present disclosure. Golden devices 222, field-programmable gate array (FPGA) 224, logic devices 226, memory devices 228, and the like can be soldered to, or socketed on, the compliant printed circuit tester interface 220 to provide tester electronics, reducing or enhancing the tester resources. RF Wireless devices 230 can be added to facilitate wireless communication and data transfer between the operator, the tester interface 220 and the device under test.

FIG. 11 is a side sectional view of a method of making a compliant printed circuit semiconductor tester interface 250 incorporating a connector function in accordance with an embodiment of the present disclosure. Substrate 252 includes a plurality of cavities 254 extending through dielectric layer 256. The cavities 254 can be formed using a variety of techniques, such as molding, machining, printing, imprinting, embossing, etching, coining, and the like. Although the cavities 254 are illustrated as truncated cones or pyramids, a variety of other shapes can be used, such as for example, cones, hemispherical shapes, and the like.

As illustrated in FIG. 13, metalizing layer is printed in the cavities 254 to create contact member 258 and compliant layer 260 is printed on the dielectric layer 256, followed by dielectric layer 262 establishing circuit geometry.

FIG. 14 illustrates circuit geometries 264 printed as discussed above. In one embodiment, the circuit geometries 264 are formed by depositing a conductive material in a first state in the recesses, and then processed to create a second more permanent state. For example, the metallic powder is printed according to the circuit geometry and subsequently sintered, or the curable conductive material flows into the circuit geometry and is subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source.

Second compliant layer 270 is printed on exposed surfaces 272 of the dielectric layers 262 and circuit geometries 264. The second compliant layer 270 and second dielectric layer 274 are selectively printed to permit printing of contact member 276. Alternatively, pre-fabricated contact members 276 can be bonded to the circuit geometries 264. As used herein, "bond" or "bonding" refers to, for example, adhesive bonding, solvent bonding, ultrasonic welding, thermal bonding, or any other techniques suitable for attaching adjacent layers to a substrate.

The dielectric layer 274 adjacent contact members 276 is optionally singulated to permit greater compliance. As used herein, "singulated" refers to slits, cuts, depressions, perforations, and/or points of weakness. In another embodiment, the compliant printed circuit semiconductor tester interface 250 is made in two portions and then bonded together.

FIG. 15 illustrates a compliant printed circuit tester interface 330 with compliant structure 332 printed to add compliance and normal force 334 external to the circuit geometry 336. For example, the compliant structure 332 can be a printed/sintering metallic spring. In another embodiment, the compliant structure 332 is a stamped or etched metallic, plastic, or overmolded leadframe that is added to the compliant printed circuit semiconductor tester interface 330. The compliant members 332 can optionally be singulated in tandem with the circuit geometry 336 to allow for individual contact compliance.

FIG. 16 illustrates a compliant printed circuit tester interface 350 with male contact member 352 in accordance with an embodiment of the present disclosure. Contact member 352 is preferably inserted through opening 354 printed in dielectric layers 356, 358 and circuit geometry 360. The resiliency of the dielectric layers 356, 358 permits plastic deformation to permit enlarged end 362 to penetrate the opening 354 in the compliant printed circuit semiconductor tester interface 350. The resilience of the dielectric layers 356, 358 also permit the contact member 360 to move in all six degrees of freedom (X-Y-Z-Pitch-Roll-Yaw) to facilitate electrical coupling with first and second circuit members 364, 366.

FIG. 17 illustrates a compliant printed circuit semiconductor tester interface 370 with printed compliant member 372 located above contact member 374 in accordance with an embodiment of the present disclosure. The printed compliant member 372 and associated contact member 374 is preferably singulated to promote flexure and compliance.

FIG. 18 illustrates an alternate embodiment of a compliant printed circuit semiconductor tester interface 380 where printed compliant member 382 is located on circuit member 384. In the illustrated embodiment, secondary printed compliant member 386 is located on the compliant printed circuit semiconductor tester interface 380 above contact member 388.

Figure 19:
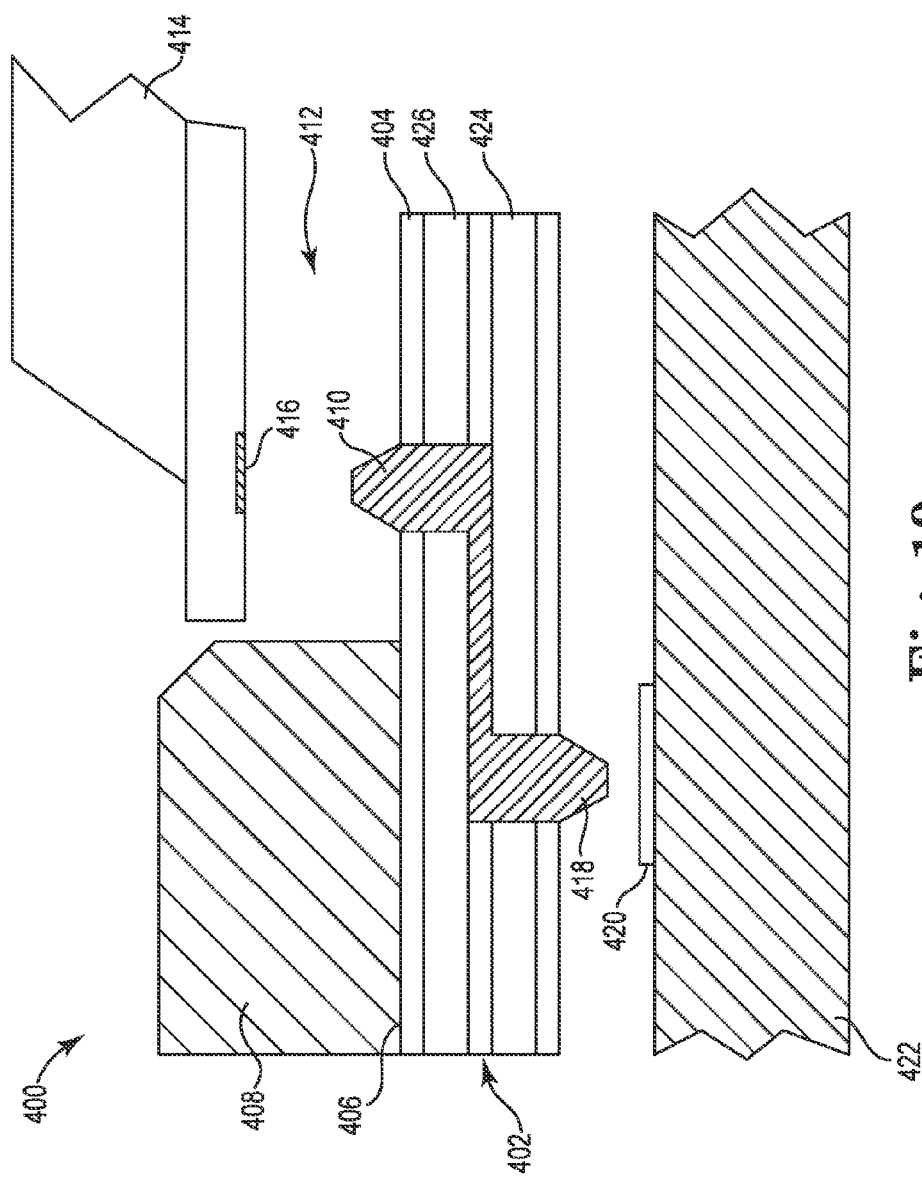
FIG. 19 illustrates a socket assembly incorporated into a compliant printed circuit semiconductor tester interface in accordance with an embodiment of the present disclosure.

FIG. 19 illustrates a socket assembly 400 for a compliant printed circuit tester interface 402 in accordance with an embodiment of the present disclosure. Dielectric layer 404 is bonded to surface 406 of socket housing 408 so that contact members 410 are positioned in recess 412. First circuit member 414, such as an IC device, is positioned in the recess 412 so that the terminals 416 align with the contact members 410.

Contact members 410, 418 are optionally plated, either before or after the compliant printed circuit semiconductor tester interface 402 is installed in the socket housing 408. In another embodiment, the contact members 410, 418 are deformed, such as for example by coining or etching, to facilitate engagement with terminals 414 on the first circuit member 414 and/or terminal 420 on second circuit member 422.

In operation, the first circuit member 414, socket assembly 400 and the second circuit member 422 are compressively coupled so that contact member 410 electrically couples with terminal 416 and contact member 418 electrically couples with contact pad 420. Compliant layer 424 biases the contact member 410 into engagement with the terminal 416, while the compliant layer 426 biases the contact member 418 into engagement with the pad 420. The compliant layers 424, 426 also permit the contact members 410, 418 to deflect and compensate for non-planarity of the terminals 416 or the pads 418. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

Figure 20:
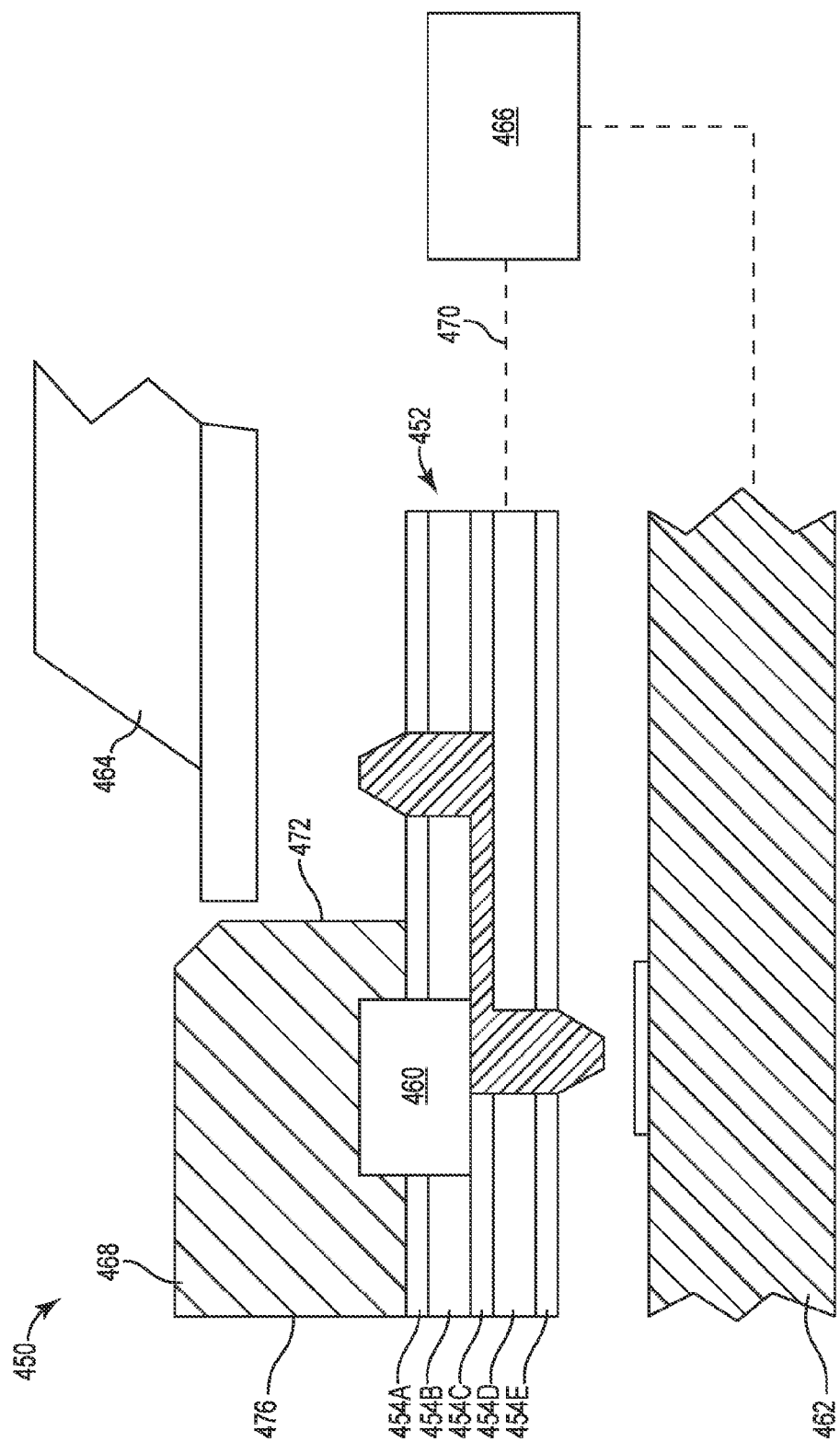
FIG. 20 illustrates a socket assembly with printed electrical devices incorporated into a compliant printed circuit semiconductor tester interface in accordance with an embodiment of the present disclosure.

FIG. 20 is an alternate tester interface 450 with additional functionality built into the compliant printed circuit 452 in accordance with an embodiment of the present disclosure. One or more of the layers 454A, 454B, 454C, 454D, and 454E (collectively "454") can include additional functionality, such as for example, specialty dielectrics, ground planes, power planes, shielding layers, stiffening layers, capacitive coupling features, circuitry layers, and the like. The layers 454 can be printed or preformed and selectively bonded or non-bonded to provide contiguous material or releasable layers.

The additional functionality can also be provided by additional electrical devices 460, preferably positioned adjacent to a recess 472 of a socket housing 468 that receives the IC device 464. The electrical devices 460 can be shielding, near device decoupling, capacitors, transistors, resistors, filters, signal or power altering and enhancing devices, memory devices, embedded IC, RF antennae, and the like. The electrical devices 460 can be added as discrete components or printed onto one of the layers. The electrical devices 460 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

In one embodiment, the compliant printed circuit 452 extends beyond a perimeter edge 476 of the socket housing 468. In one embodiment, an extension 470 including a flexible circuit member can be electrically coupled to the compliant printed circuit 452. In the illustrated embodiment, the compliant printed circuit 452 is electrically coupled to a test station 466 via the extension 470. Alternatively, the test PCB 462 can be electrically coupled to the test station 466.

The testing protocol can reside on the test PCB 462, the test station 466, or a combination thereof. Reference herein to the test PCB should be construed to encompass the test station, either coupled to the test PCB or directly to the compliant printed circuit.

In one embodiment, the electrical devices 460 monitor the testing of the IC device 464 and communicate feedback to test station 466. In one embodiment, the feedback signal from the electrical devices 460 can cause the test station 466 to alter the testing protocol based on the performance of the IC device 464. This can be referred to as adaptive testing. In one embodiment, the feedback signal from the electrical devices 460 can cause the test station 466 to alter the IC device 464, such as for example, by altering software resident on the IC device 464.

Figure 21:
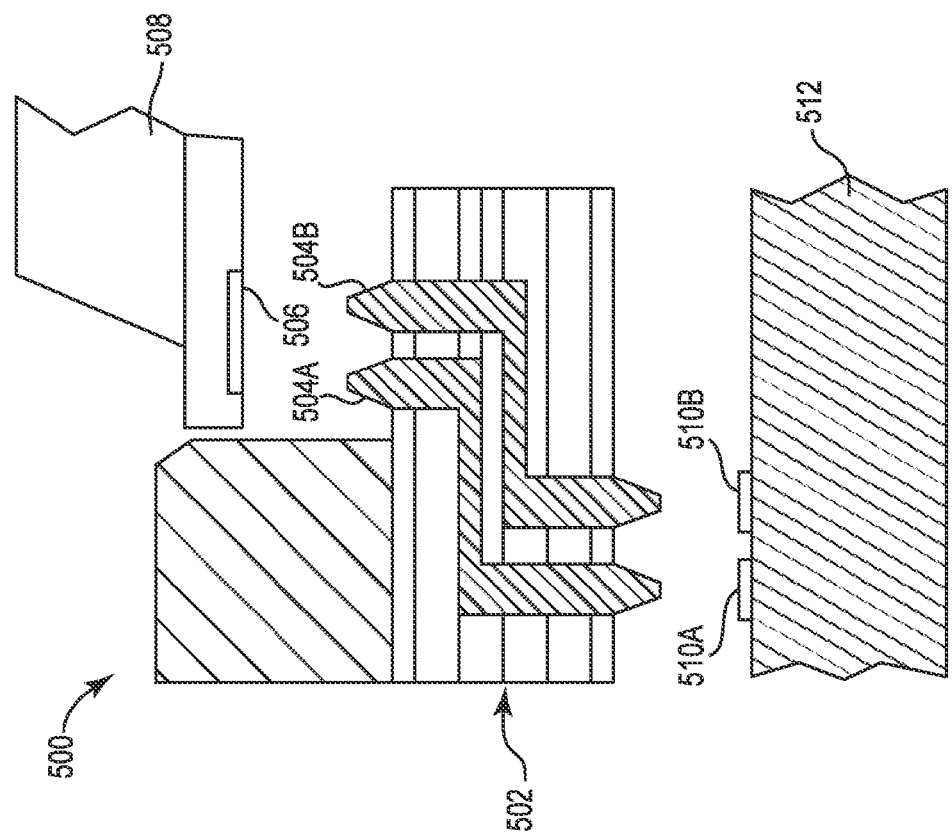
FIG. 21 illustrates a socket assembly with redundant contact members incorporated into a compliant printed circuit semiconductor tester interface in accordance with an embodiment of the present disclosure.

FIG. 21 is a tester interface 500 in accordance with another embodiment of the present disclosure. The compliant printed circuit 502 can include multiple contacts 504A, 504B (collectively "504") for each terminal 506 on an IC device 508. The redundant contacts 504 can increase reliability and permit Kelvin measurements, which require two separate contact points at the terminal 506 of the IC device 508 routed to separate pads 510A, 510B (collectively "510") on the test PCB 512.

Figure 22:
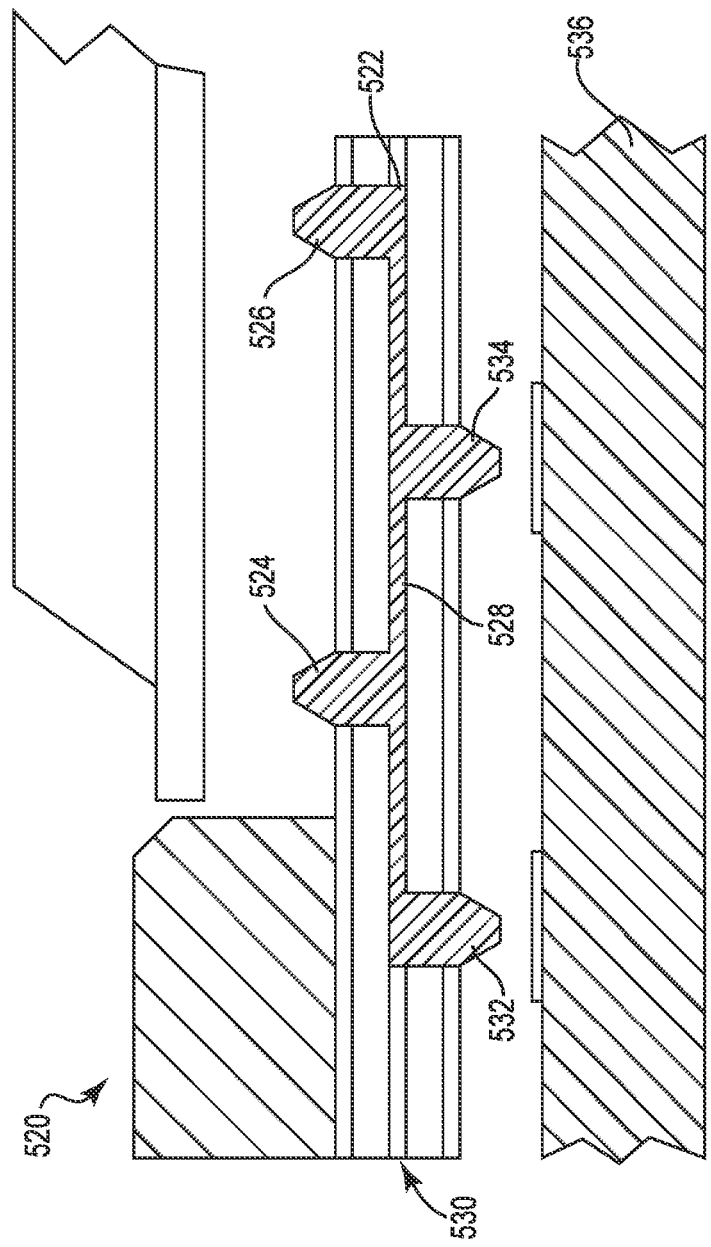
FIG. 22 illustrates a socket assembly with a common ground plane incorporated into a compliant printed circuit semiconductor tester interface in accordance with an embodiment of the present disclosure.

FIG. 22 is tester interface 520 with common ground plane 522 in accordance with another embodiment of the present disclosure. Grounding contact members 524, 526 can be coupled to a common conductive trace 528 in the compliant printed circuit 530. The conductive trace 528 functions as a grounding plane 522. The grounding contact members 532, 534 can connect the ground plane 522 to a test PCB 536.

Figure 23:
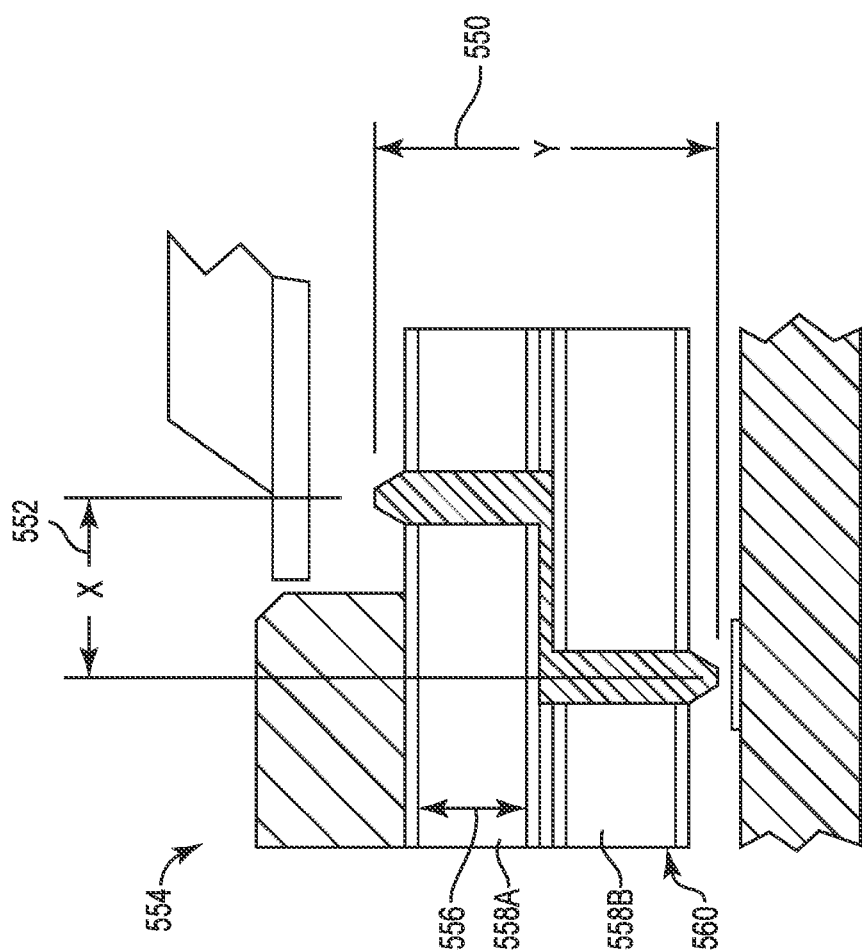
FIG. 23 illustrates a socket assembly with adjusted contact height and lateral offset incorporated into a compliant printed circuit semiconductor tester interface in accordance with an embodiment of the present disclosure.

FIG. 23 is a test socket 554 having adjusted contact height 550 and lateral offset 552, in accordance with an embodiment of the present disclosure. FIG. 23 illustrates the adaptive capabilities of the present disclosure by showing an ability to adjust contact height 550 and lateral offset 552 of test sockets 554. Increasing thickness 556 of one or both of the compliant layers 558A, 558B can permit the contact height 550 to be adjusted. The printing technology used to create the compliant printed circuit 5260 allows lateral offset 552 to be easily adjust. Consequently, compliant printed circuits in accordance with various embodiments of the present disclosure can be adapted for use in existing socket designs.

Figure 24:
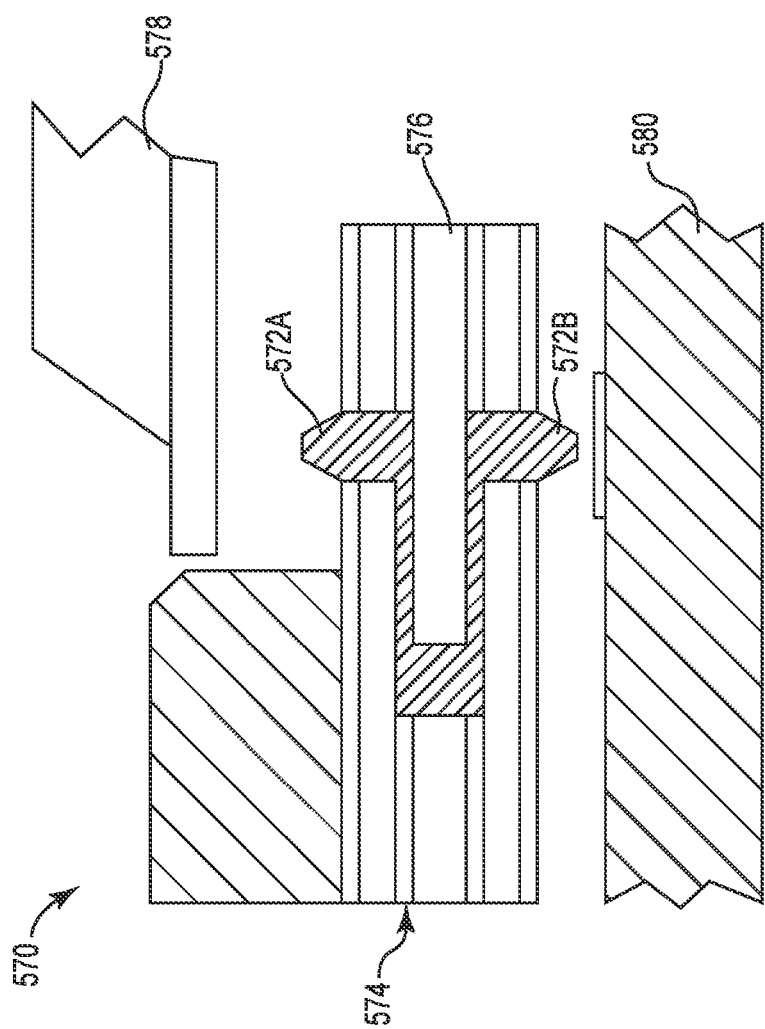
FIG. 24 illustrates a socket assembly with relocated or rerouted contact members incorporated into a compliant printed circuit semiconductor tester interface in accordance with an embodiment of the present disclosure.

FIG. 24 is a test socket 570 with relocated or rerouted contact members 572A, 572B (collectively "572") in accordance with an embodiment of the present disclosure. The test socket 570 illustrates one of various routing options of contact members of a test socket. A compliant printed circuit 574 can permit the contact members 572 to be arranged in various configurations. In the embodiment of FIG. 24, the compliant layer 576 can simultaneously bias the contact member 572A toward an IC device 578 and the contact member 572B toward the test PCB 580.

Figure 25:
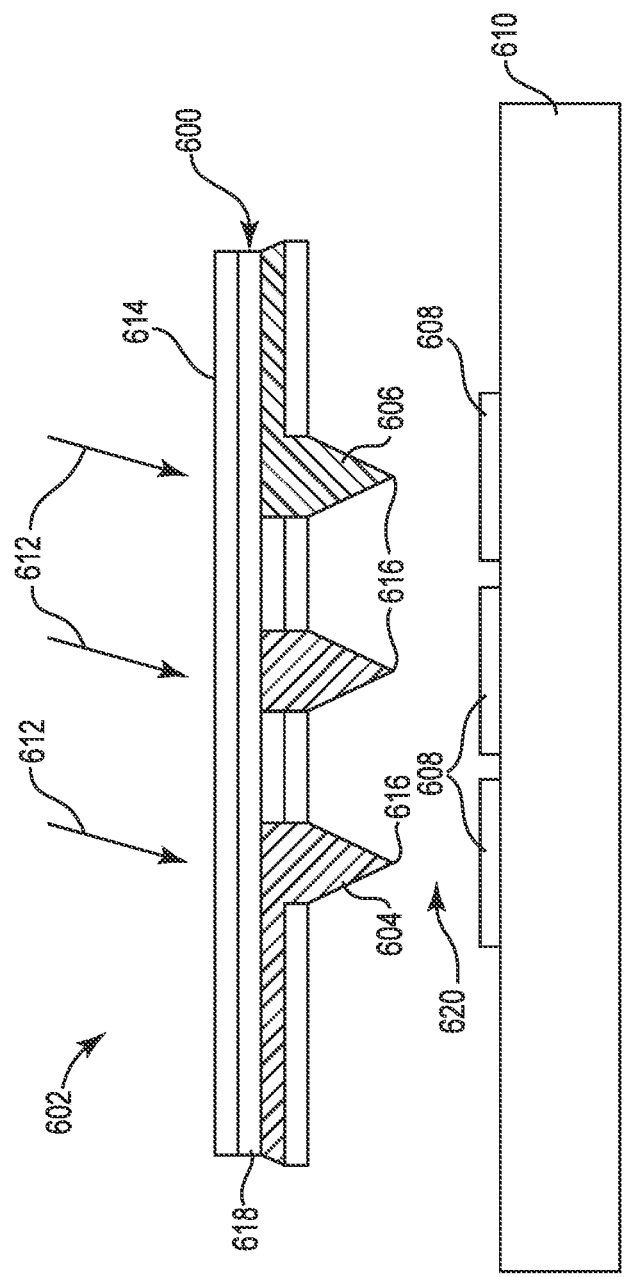
FIG. 25 is a cross-sectional view of a probe assembly incorporated into a compliant printed circuit semiconductor tester interface in accordance with an embodiment of the present disclosure.

FIG. 25 illustrates the probe assembly 600 merged with a tester interface 602 in accordance with an embodiment of the present disclosure. Exposed portions 604 of the probe members 606 are optionally plated. In another embodiment, the probe members 606 are further processed, such as for example by coining or etching, to facilitate engagement with terminals 608 on a circuit member 610. Although the present probe assembly 600 can be particularly well suited for probing wafer-level integrated circuits, it can be used on a variety of other circuit members, such as for example, packaged integrated circuits, unpackaged integrated circuits, printed circuit boards, flexible circuits, bare-die devices, organic or inorganic substrates, or any other device capable of carrying electrical current.

In operation, a normal force 612 can be applied to a top surface 614 of the probe assembly 600 so the distal ends 616 of the probe members 606 electrically couple with the terminals 608 on the circuit member 610. The compliant layer 618 can compensate for non-planarity at the interface 620.

Figure 26:
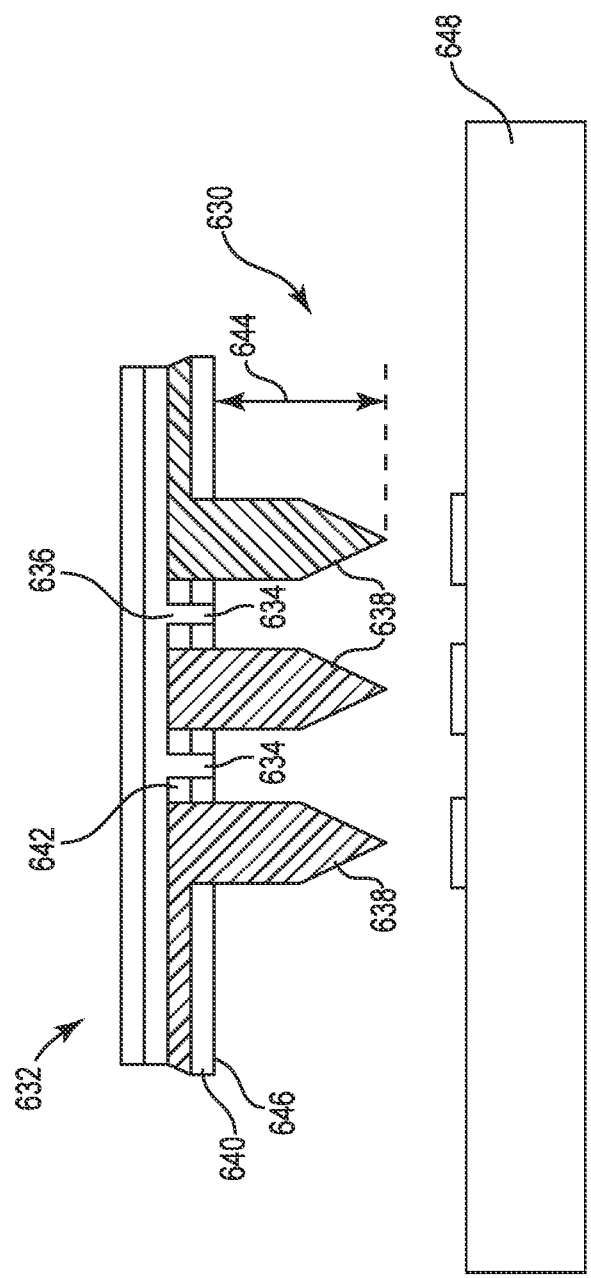
FIG. 26 is a cross-sectional view of an alternate probe assembly incorporated into a compliant printed circuit semiconductor tester interface in accordance with an embodiment of the present disclosure.

FIG. 26 is a cross-sectional view of an alternate probe assembly 630 coupled to tester interface 632 in accordance with an embodiment of the present disclosure. Gaps 634, 636 are located substantially adjacent to probe members 638 to provide a degree of compliance. The gaps 634, 636 decouple compliance of probe members 638 from dielectric layers 640, 642. Height 644 of the probe members 638 can be increased to reduce the chance of a bottom surface 646 of the dielectric layer 640 contacting wafer 648.

Figure 27:
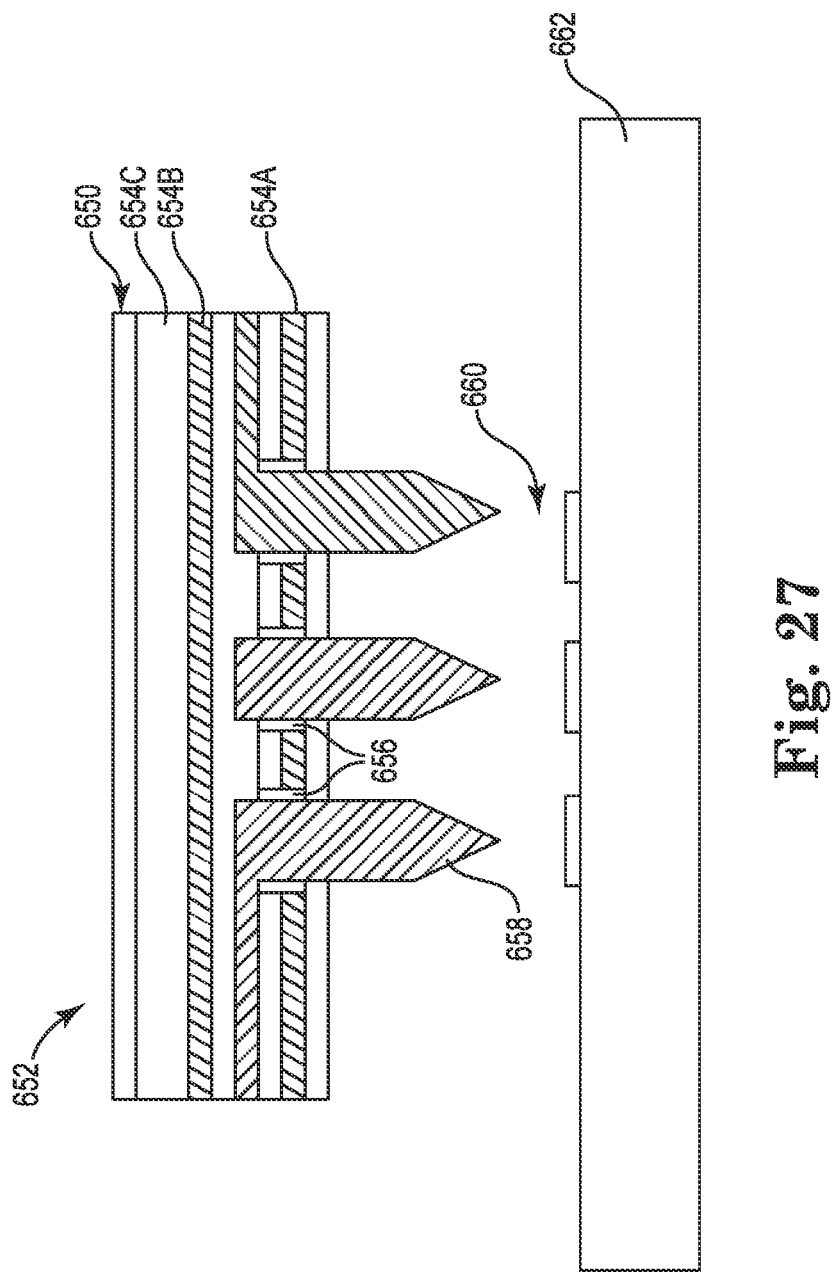
FIG. 27 is a cross-sectional view of a probe assembly with circuitry layers incorporated into a compliant printed circuit semiconductor tester interface in accordance with an embodiment of the present disclosure.

FIG. 27 is a cross-sectional view of an alternate probe assembly 650 for tester interface 652 with additional functional layers 654A, 654B, 654C (collectively "654"), in accordance with an embodiment of the present disclosure. The functional layers can be, for example, specialty dielectrics, ground planes, power planes, shielding layers, stiffening layers, capacitive coupling features, circuitry layers, and the like. The layers 654 can be printed or preformed and selectively bonded or non-bonded to provide contiguous material or releasable layers.

In the illustrated embodiment, layers 654A and 654B are ground planes. Layer 654C is a compliant layer that operates in either alone or in conjunction with gaps 656 adjacent to the probe members 658 to compensate for non-planarity at the interface 660 with the wafer 662.

Figure 28:
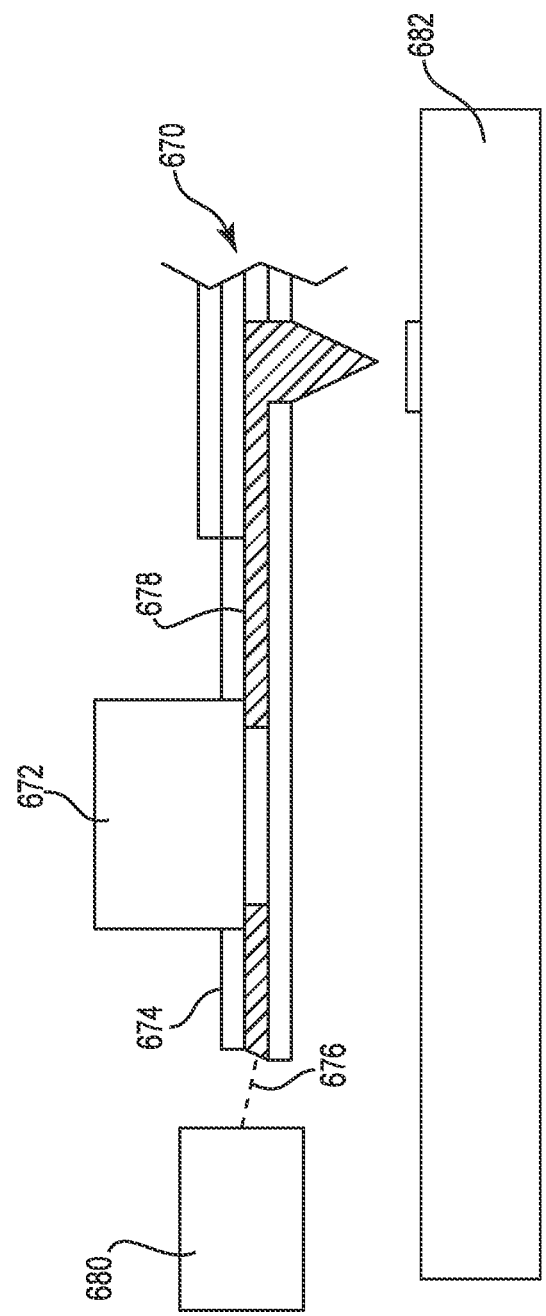
FIG. 28 is a cross-sectional view of a probe assembly with printed electrical devices incorporated into a compliant printed circuit semiconductor tester interface in accordance with an embodiment of the present disclosure.

FIG. 28 is a cross-sectional view of a probe assembly 670 with additional electrical devices 672 in accordance with embodiments of the present disclosure. The electrical devices 672 can be capacitors, transistors, resistors, filters, signal or power altering and enhancing devices, memory devices, an embedded IC, an RF antennae, and the like. The electrical devices 672 can be located on surface 674 or embedded in one of the layers. The probe assembly 670 can include an extension 676, such as for example a flexible circuit member, electrically coupling conductive traces 678 to test station 680.

The electrical devices 672 can be added as discrete components or printed onto one of the layers. The electrical devices 672 can be printed using inkjet printing technology, aerosol printing technology, or other maskless deposition techniques, as previously described. Electrical devices that are typically located on the test station 680 can be incorporated into the probe assembly 670, improving electrical performance.

In one embodiment, the electrical devices 672 monitor the testing of the circuit member 682 and communicate feedback to the test station 680. In one embodiment, a feedback signal from the electronic devices 672 can cause the test station 680 to alter the testing protocol depending on the performance of the circuit member 682, referred to as adaptive testing. In one embodiment, the feedback signal from the electronic devices 672 can cause the test station 680 to alter the circuit member 682, such as for example, by altering software resident on the circuit member 682.

FIG. 29 is a cross-sectional view of a probe assembly 700 with multiple layers 702 in accordance with an embodiment of the present disclosure. The probe assembly 700 can permit IC manufactures to reduce the pitch 704 of the terminals 706 on the IC devices 708 since the required signal routing to a test station 710 is performed by the probe assembly 700.

FIG. 30 is a cross-sectional view of a probe assembly 720 with coupling features 722 in accordance with an embodiment of the present disclosure. In one embodiment, the coupling features 722 can be capacitive couplings located between dielectric layers 724, 726. In another embodiment, the coupling features 722 can be optical fibers supported by the dielectric layers 724, 726. Optical quality materials can optionally be printed directly onto the dielectric layers 724, 726. The printing process can also allow for deposition of coatings in-situ that will enhance the optical transmission or reduce loss. The precision of the printing process can resolve misalignment issues when the optical fibers 722 are placed into a connector. In another embodiment, the coupling features 722 can be embedded coaxial or printed micro strip RF circuits with dielectric layers 724, 726. The dielectric layers 724, 726 can be formed of metal. Any of the structures noted above, as well as the probe members 728, can be created by printing dielectrics and metallization geometry.

FIG. 31 illustrates tester interface 750 merged with compliant conductive interconnect 752 in accordance with an embodiment of the present disclosure. Compliant material 754 is printed directly on the tester interface 750 so through holes 756 are generally aligned with contact pads 758. Conductive particles 760 are then deposited in the through holes 756. Contact tips 762 are secured to distal surface 764 of the compliant material 754 by one or more covering layers 766. Electrical devices 768 are optionally printed as part of the interconnect assembly 752, as discussed above. As used herein, "conductive particles" refers to a plurality of free-flowing conductive elements, substantially free of binders or other non-conductive materials.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A compliant printed circuit semiconductor tester interface providing a temporary interconnect between terminals on integrated circuit (IC) devices being tested, the compliant printed circuit semiconductor tester interface comprising:
   at least one dielectric layer printed with recesses corresponding to a target circuit geometry;
   a conductive material deposited in at least a portion of the recesses comprising a circuit geometry and a plurality of first contact pads formed in the at least one dielectric layer, the circuit geometry comprising a plurality of conductive traces electrically coupled to the plurality of first contact pads accessible along a first surface of the compliant printed circuit;
   at least one dielectric covering layer;
   a plurality of openings in the dielectric covering layer permitting electrical coupling of the terminals on the IC device and the first contact pads, the circuit geometry extending beyond the openings in the covering layer;
   one or more compliant layers positioned to elastically bias a plurality of the first contact pads against the terminals on the IC device; and
   testing electronics electrically coupled to the portion of the circuit geometry that extends beyond the openings in the dielectric layer to test electrical functions of the IC device.

2. The compliant printed circuit semiconductor tester interface of claim 1 comprising at least one electrical device located on the compliant printed circuit and electrically coupled to the circuit geometry.

3. The compliant printed circuit semiconductor tester interface of claim 2 wherein the electrical devices comprise at least a portion of the testing electronics.

4. The compliant printed circuit semiconductor tester interface of claim 1 comprising at least one electrical device printed on one of the dielectric layers and electrically coupled to at least a portion of the circuit geometry.

5. The compliant printed circuit semiconductor tester interface of claim 4 wherein the electrical device is selected from one of shielding, near device decoupling, capacitors, transistors, resistors, filters, signal or power altering and enhancing devices, memory devices, embedded IC devices, or RF antennae.

6. The compliant printed circuit semiconductor tester interface of claim 1 comprising a socket housing coupled to the compliant printed circuit, the first contact pads positioned in a socket housing recess sized to receive the IC device.

7. The compliant printed circuit semiconductor tester interface of claim 1 comprising an optical quality material deposited in at least a portion of the recesses comprising one or more optical circuit geometries.

8. The compliant printed circuit semiconductor tester interface of claim 1 comprising one or more optical fibers located in at least a portion of the recesses comprising one or more optical circuit geometries.

9. The compliant printed circuit semiconductor tester interface of claim 1 comprising one or more of the first contact pads extend above the dielectric covering layer.

10. The compliant printed circuit semiconductor tester interface of claim 9 wherein the first contact pads comprise probe members of a probe assembly.

11. The compliant printed circuit semiconductor tester interface of claim 1 wherein the compliant printed circuit semiconductor tester interface is singulated adjacent at least one of the first contact pads.

12. The compliant printed circuit semiconductor tester interface of claim 1 wherein the conductive traces in the circuit geometry comprise substantially rectangular cross-sectional shapes.

13. The compliant printed circuit semiconductor tester interface of claim 1 wherein a conductive material, a non-conductive material, and a semi-conductive material are printed on a single layer.

14. The compliant printed circuit semiconductor tester interface of claim 1 comprising:
　　a first portion of the circuit geometry extending beyond the dielectric covering layer;
　　a compliant material located along a surface of the first portion of the circuit geometry; and
　　a second portion of the circuit geometry located on top of the compliant material, the first and second portions of the circuit geometry comprising an edge connector.

15. The compliant printed circuit semiconductor tester interface of claim 1 comprising at least one additional circuitry plane.

16. The compliant printed circuit semiconductor tester interface of claim 15 wherein the at least one additional circuitry plane comprises one of a ground plane, a power plane, an electrical connection to other circuit members, a dielectric layer, or a flexible circuit.

17. The compliant printed circuit semiconductor tester interface of claim 1 comprising a plurality of second contact pads accessible along a second surface of the compliant printed circuit, wherein the testing electronics are coupled to the circuit geometry through the second contact pads.

\* \* \* \* \*